United States Patent
Samuelson et al.

(10) Patent No.: US 11,693,020 B2
(45) Date of Patent: Jul. 4, 2023

(54) ACCELEROMETER HAVING A ROOT-MEAN-SQUARE (RMS) OUTPUT

(71) Applicants: ROHM Co., Ltd., Kyoto (JP); Kionix, Inc., Ithaca, NY (US)

(72) Inventors: Brian Thomas Samuelson, Owego, NY (US); Richard Alan Deken, Madison, MS (US); Yo Yamashiro, Kyoto (JP)

(73) Assignees: ROHM Co., Ltd., Kyoto (JP); Kionix, Inc., Ithaca, NY (US)

( * ) Notice: Subject to any disclaimer, the term of this patent is extended or adjusted under 35 U.S.C. 154(b) by 141 days.

(21) Appl. No.: 16/669,111

(22) Filed: Oct. 30, 2019

(65) Prior Publication Data
US 2020/0141966 A1    May 7, 2020

Related U.S. Application Data

(63) Continuation-in-part of application No. 16/512,265, filed on Jul. 15, 2019, now abandoned.
(Continued)

(51) Int. Cl.
  *G01P 15/08* (2006.01)
  *B81B 3/00* (2006.01)
(52) U.S. Cl.
  CPC ........ *G01P 15/0802* (2013.01); *B81B 3/0021* (2013.01); *B81B 2201/0235* (2013.01)
(58) Field of Classification Search
  CPC .................................................. G01P 15/0802
  (Continued)

(56) References Cited

U.S. PATENT DOCUMENTS 6,883,638 B1 * 4/2005 Maxwell .............. G01D 11/245
                                                              181/102
9,778,040 B1   10/2017 Iascone et al.
(Continued)

FOREIGN PATENT DOCUMENTS

TW           I526688       3/2016
TW           I537544       6/2016
WO      2018/197860 A1   11/2018

OTHER PUBLICATIONS

Lavry, D. "Understanding FIR (Finite Impulse Response) Filters—An Intuitive Approach" [online], Lavry Engineering, 1997 [retrieved on Jan. 16, 2020], Retrieved from the Internet: <URL: http://lavryengineering.com/pdfs/lavry-understanding-fir-filters.pdf>, total: 7 pages.
(Continued)

*Primary Examiner* — Walter L Lindsay, Jr.
*Assistant Examiner* — Philip T Fadul
(74) *Attorney, Agent, or Firm* — Wade IP Law PLLC

(57) ABSTRACT

Accelerometers are described herein that have RMS outputs. For instance, an example accelerometer may include a MEMS device and an ASIC. The MEMS device includes a structure having an attribute that changes in response to acceleration of an object. The ASIC determines acceleration of the object based at least in part on changes in the attribute. The ASIC includes analog circuitry, an ADC, and firmware. The analog circuitry measures the changes in the attribute and generates analog signals that represent the changes. The ADC converts the analog signals to digital signals. The firmware includes RMS firmware. The RMS firmware performs an RMS calculation on a representation of the digital signals to provide an RMS value that represents an amount of the acceleration of the object.

24 Claims, 27 Drawing Sheets

Related U.S. Application Data

(60) Provisional application No. 62/756,546, filed on Nov. 6, 2018.

(58) Field of Classification Search
USPC .................................................. 73/514.01
See application file for complete search history.

(56) References Cited

U.S. PATENT DOCUMENTS

| | | | |
|---|---|---|---|
| 2004/0107775 A1* | 6/2004 | Kim | G01D 5/24 73/714 |
| 2011/0109330 A1 | 5/2011 | Toshio et al. | |
| 2011/0267212 A1 | 11/2011 | Denison | |
| 2011/0319782 A1* | 12/2011 | Sweeney | A61N 1/36514 600/528 |
| 2012/0303319 A1* | 11/2012 | Kirkeby | G01C 22/006 702/160 |
| 2014/0142886 A1 | 5/2014 | Hergesheimer et al. | |
| 2016/0146852 A1* | 5/2016 | Romano | G01P 21/00 73/488 |
| 2016/0284361 A1* | 9/2016 | Yamamoto | G10L 25/18 |
| 2016/0341762 A1 | 11/2016 | Waters et al. | |
| 2017/0112470 A1* | 4/2017 | Sharafat | A61B 8/463 |
| 2018/0011125 A1 | 1/2018 | Oshima et al. | |
| 2018/0052006 A1 | 2/2018 | Ell | |

OTHER PUBLICATIONS

"Extended European Search Report" issued in European Patent Application No. 19883235.4, dated Nov. 26, 2021, 13 Pages.

Quinnell, Richard A., "Switched-Capacitor Filter ICs", EDN, vol. 35, No. 1, Jan. 4, 1990, 10 Pages.

Duggal, Ashwin R., "Calibration of Delta-Sigma Data Converters in Synchronous Demodulation Sensing Applications", IEEE Sensors Journal, vol. 11, No. 1, Jan. 2011, pp. 16-22.

"Notice of Reasons for Refusal" issued in Japanese Patent Application No. 2020-558600, dated Sep. 7, 2021, 3 pages.

"Decision to Grant a Patent" issued in Japanese Patent Application No. 2020-558600, dated Dec. 3, 2021, 5 pages.

"International Search Report and Written Opinion" issued in PCT Application No. PCT/US19/59922, dated Jun. 16, 2020, 16 pages.

"International Preliminary Report on Patentability" issued in PCT Application No. PCT/US19/59922, dated May 20, 2021, 12 pages.

"Official Letter and Search Report" issued in Taiwan Patent Application No. 108140216, dated Nov. 3, 2020, 10 pages.

"Decision of Patent Examination" issued in Taiwan Patent Application No. 108140216, dated May 4, 2021, 4 pages.

\* cited by examiner

Block I/O Ports (part 1 of 2)

| Port Name | Type | Dir | Function | Notes |
|---|---|---|---|---|
| clk_rms_sc | | O | Clock gated on only when RMS engine processing | |
| req_clkhfao_rms_syn | | O | Req oscillator run for RMS engine | |
| rms_data_out[15:0] | signed | O | Data to output registers | |
| rms_data_eng[11:0] | biased | O | Data to wake/sleep engine | |
| rms_out_this_odr | | O | RMS engine will send new output this ODR cycle | |
| rms_running | | O | RMS engine is running | |
| rms_wr_engx | | O | Writing x-axis data to rms_data_eng | |
| rms_wr_engy | | O | Writing y-axis data to rms_data_eng | |
| rms_wr_engz | | O | Writing z-axis data to rms_data_eng | |
| rms_wr_outx | | O | Writing x-axis data to rms_data_out | |
| rms_wr_outy | | O | Writing y-axis data to rms_data_out | |
| rms_wr_outz | | O | Writing z-axis data to rms_data_out | |
| clk_sc | | I | Main clock (3.2768MHz) | |
| gainsel[1:0] | unsigned | I | Gain select setting | User register |
| lp_avgsdata_out_2s[18:0] | signed | I | Low-power filter data (+/-16g range) | |
| read_x | | I | lp_avgsdata_out_2s contains valid X data | |
| read_y | | I | lp_avgsdata_out_2s contains valid Y data | |
| read_z | | I | lp_avgsdata_out_2s contains valid Z data (last of seq.) | |

FIG. 13

Block I/O Ports (part 2 of 2)

| Port Name | Type | Dir | Function | Notes |
|---|---|---|---|---|
| rms_bp_osel | | I | Band-pass output select (0-filt, 1=rms) | User register |
| rms_byp[1:0] | | I | Stage bypasses ([0] = filter 1, [1] = filter 2, [2] = rms stage) | User register |
| rms_f1_1a[6:0] | unsigned | I | Filter 1 1/A gain coefficient (implicit 1 in bit 7) | User register |
| rms_f1_ba[22:0] | unsigned | I | Filter 1 B/A integrator coefficient | User register |
| rms_f1_ca[22:0] | unsigned | I | Filter 1 C/A integrator coefficient | User register |
| rms_f1_ish[4:0] | mapped | I | Filter 1 input scale shift value (0-18 used, see mapping) | User register |
| rms_f1_osh | unsigned | I | Filter 1 output scale shift value | User register |
| rms_f2_1a[6:0] | unsigned | I | Filter 2 1/A gain coefficient (implicit 1 in bit 7) | User register |
| rms_f2_ba[14:0] | unsigned | I | Filter 2 B/A integrator coefficient | User register |
| rms_f2_hp | | I | Filter 2 high-pass select | User register |
| rms_f2_ish[4:0] | mapped | I | Filter 2 input scale shift value (0-18 used, see mapping) | User register |
| rms_f2_osh[4:0] | unsigned | I | Filter 2 output scale shift value (valid 0-20) | User register |
| rms_nrms[3:0] | mapped | I | Number sample to calculate RMS over (0=2, 1=4, 2=8 ...) | User register |
| rms_odr_actv | | I | This ODR cycle is for RMS engine | |
| rms_wb_osel | | I | Wake/Sleep engine output select (0-filt, 1=rms) | User register |
| rmse | | I | RMS engine enable | |
| rst_pc1_clk_b | | I | Main reset for synch use | |
| rst_pc1_clk_b_sr | | I | Main reset for asynch use (w/ scan reset) | |
| shf_init_gate | | I | Gate control for clock gate during init cycle or scan shift | |

FIG. 14

Table 1: rms_f1_ish and rms_f2_ish mapping — 1800

| rms_f*_ish input | rms_f*_ish_map output | rms_f*_ish input | rms_f*_ish_map output | rms_f*_ish input | rms_f*_ish_map output |
|---|---|---|---|---|---|
| 0 | 0 | 8 | 8 | 16 | 16 |
| 1 | 1 | 9 | 9 | 17 | 17 |
| 2 | 2 | 10 | 10 | 18 | 18 |
| 3 | 3 | 11 | 11 | 19 | 18 |
| 4 | 4 | 12 | 12 | 20 | 18 |
| 5 | 5 | 13 | 13 | 21 | 18 |
| 6 | 6 | 14 | 14 | 22 | 18 |
| 7 | 7 | 15 | 15 | 23 | 18 |

| rms_f*_ish input | rms_f*_ish_map output |
|---|---|
| 24 | 18 |
| 25 | 18 |
| 26 | 18 |
| 27 | 18 |
| 28 | 18 |
| 29 | 18 |
| 30 | 18 |
| 31 | 18 |

FIG. 18

Table 2: rms_f2_osh mapping — 1900

| rms_f2_osh input | rms_f2_osh_map output | rms_f2_osh input | rms_f2_osh_map output | rms_f2_osh input | rms_f2_osh_map output |
|---|---|---|---|---|---|
| 0 | 0 | 8 | 8 | 16 | 16 |
| 1 | 1 | 9 | 9 | 17 | 17 |
| 2 | 2 | 10 | 10 | 18 | 18 |
| 3 | 3 | 11 | 11 | 19 | 19 |
| 4 | 4 | 12 | 12 | 20 | 20 |
| 5 | 5 | 13 | 13 | 21 | 20 |
| 6 | 6 | 14 | 14 | 22 | 20 |
| 7 | 7 | 15 | 15 | 23 | 20 |

| rms_f2_osh input | rms_f2_osh_map output |
|---|---|
| 24 | 20 |
| 25 | 20 |
| 26 | 20 |
| 27 | 20 |
| 28 | 20 |
| 29 | 20 |
| 30 | 20 |
| 31 | 20 |

FIG. 19

ACCELEROMETER HAVING A ROOT-MEAN-SQUARE (RMS) OUTPUT

CROSS-REFERENCE TO RELATED APPLICATION(S)

The present application is a continuation-in-part of copending U.S. patent application Ser. No. 16/512,265, filed on Jul. 15, 2019, currently pending, which claims the benefit of U.S. Provisional Application No. 62/756,546, filed Nov. 6, 2018 and entitled "Accelerometer Having a Root-Mean-Square (RMS) Output," the disclosures of which are incorporated by reference herein in their entireties.

BACKGROUND

Technical Field

The subject matter described herein relates to an accelerometer.

Background

An accelerometer is a device that measures acceleration forces on an object (i.e., forces on the object that are caused by acceleration of the object). The acceleration of the object is the rate of change of velocity of the object. The acceleration forces may include static acceleration forces and dynamic acceleration forces. An example of a static acceleration force is a gravitational force on the object caused by the Earth's gravitation. Dynamic forces are forces caused by movement (e.g., vibration) of the object.

Acceleration detection systems traditionally include an accelerometer and a processor to determine acceleration of an object. The accelerometer generates raw data signals representing the acceleration forces that are measured by the accelerometer. The processor processes the raw data signals from the accelerometer to calculate the acceleration of the object. The processor traditionally is separate from the accelerometer. For example, the processor may be formed on a chip that is different from a chip on which the accelerometer is formed. In another example, the processor may be included in a computer to which signals from the accelerometer are routed for processing.

The accelerometer traditionally is not capable of calculating the acceleration of the object in absence of the processor. Moreover, by including a processor that is separate from the accelerometer, conventional acceleration detection systems consume a substantial amount of power and a substantial amount of space.

SUMMARY

Accelerometers having root-mean-square (RMS) outputs are described herein. For instance, a first example accelerometer is described that includes a microelectromechanical systems (MEMS) device and an application-specific integrated circuit (ASIC). The MEMS device includes a structure (e.g., capacitive structure) having an attribute (e.g., capacitance) that is configured to change in response to acceleration of an object. The ASIC is configured to determine acceleration of the object based at least in part on changes in the attribute of the structure. The ASIC includes analog circuitry, an analog-to-digital converter (ADC), and RMS firmware. The analog circuitry is configured to measure the changes in the attribute of the structure and to generate analog signals that represent the changes in the attribute. The analog circuitry (AFE) is configured to convert a charge input from the MEMS to a voltage and is capable of lower-noise operation using a capacitance provided within the ASIC. The ADC is configured to convert the analog signals to digital signals. The RMS firmware is configured to perform a RMS calculation on a representation of the digital signals to provide an RMS value that represents an amount of the acceleration of the object.

Example methods are also described. In a first example method of making an accelerometer, a semiconductor package is fabricated to include a MEMS device and an ASIC. Fabricating the semiconductor package includes providing the MEMS device including a capacitive structure having a capacitance that is configured to change in response to acceleration of an object. Fabricating the semiconductor package further includes configuring the ASIC to determine acceleration of the object based at least in part on changes in the capacitance of the capacitive structure. Configuring the ASIC includes incorporating analog circuitry, an ADC, and RMS firmware into the ASIC. The analog circuitry is configured to measure the changes in the capacitance of the capacitive structure and is further configured to generate analog signals that represent the changes in the capacitance. The ADC is configured to convert the analog signals to digital signals. The RMS firmware is configured to perform a RMS calculation on a representation of the digital signals to provide an RMS value that represents an amount of the acceleration of the object.

In a second example method of making an accelerometer, a semiconductor substrate is provided. A microelectromechanical systems (MEMS) device, which includes a capacitive structure having a capacitance that is configured to change in response to acceleration of an object, is formed on the semiconductor substrate. An ASIC is formed on the semiconductor substrate to determine acceleration of the object based at least in part on changes in the capacitance of the capacitive structure. The ASIC includes analog circuitry, an ADC, and RMS firmware. Forming the ASIC on the semiconductor substrate includes configuring the analog circuitry to measure the changes in the capacitance of the capacitive structure and to generate analog signals that represent the changes in the capacitance. Forming the ASIC on the semiconductor substrate further includes configuring the ADC to convert the analog signals to digital signals. Forming the ASIC on the semiconductor substrate further includes configuring the RMS firmware to perform a RMS calculation on a representation of the digital signals to provide an RMS value that represents an amount of the acceleration of the object.

In a second example of an accelerometer, the accelerometer includes a microelectromechanical systems (MEMS) device and an application-specific integrated circuit (ASIC). The MEMS device includes a capacitive structure having a capacitance that is configured to change in response to acceleration of an object. The ASIC is configured to determine acceleration of the object based at least in part on changes in the capacitance of the capacitive structure. The ASIC is configured to calculate a representative value that represents the changes in the capacitance in a designated frequency range, and to provide an interrupt signal when the representative value is greater than or equal to a threshold value for at least a specified period of time. The representative value is a root-mean-square (RMS) of an input value.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Moreover, it is noted that the invention is not limited to the specific embodiments described in the Detailed Description and/or other sections of this document. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the disclosed technologies.

FIGS. 13 and 14 show tables of example ports for filtering and RMS functional blocks in an accelerometer in accordance with embodiments described herein.

FIGS. 18 and 19 show tables of example signal mappings in accordance with embodiments described herein.

Figure 1:
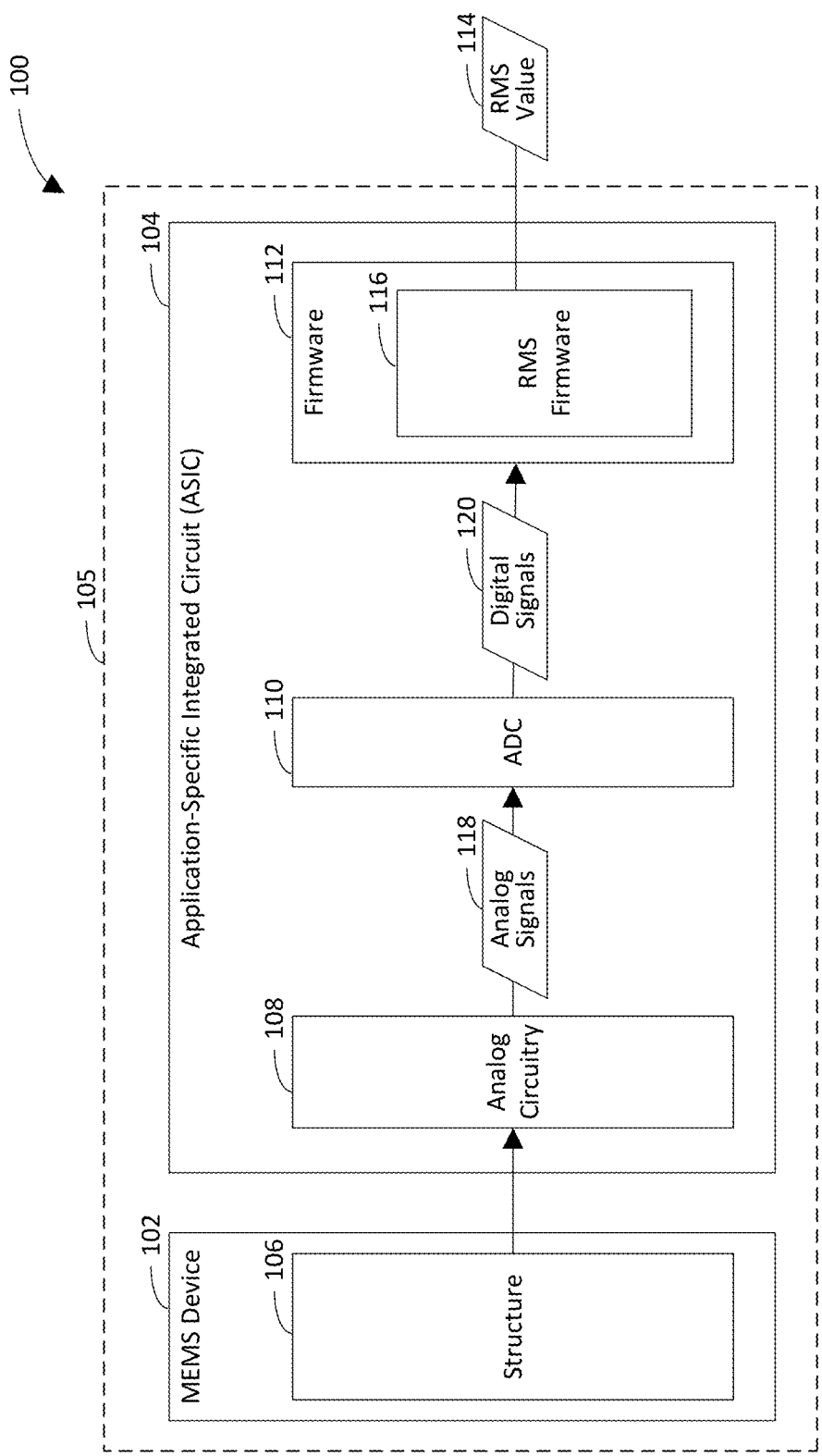
FIGS. 1-4 are block diagrams of example accelerometers that have an RMS output in accordance with embodiments described herein.

The features and advantages of the disclosed technologies will become more apparent from the detailed description set forth below when taken in conjunction with the drawings, in which like reference characters identify corresponding elements throughout. In the drawings, like reference numbers generally indicate identical, functionally similar, and/or structurally similar elements. In the figures, the drawing in which an element first appears is indicated by the leftmost digit(s) in the corresponding reference number.

DETAILED DESCRIPTION

I. Introduction

The following detailed description refers to the accompanying drawings that illustrate exemplary embodiments of the present invention. However, the scope of the present invention is not limited to these embodiments, but is instead defined by the appended claims. Thus, embodiments beyond those shown in the accompanying drawings, such as modified versions of the illustrated embodiments, may nevertheless be encompassed by the present invention.

References in the specification to "one embodiment," "an embodiment," "an example embodiment," or the like, indicate that the embodiment described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of one skilled in the relevant art(s) to implement such feature, structure, or characteristic in connection with other embodiments whether or not explicitly described.

II. Example Embodiments

Example accelerometers described herein are capable of providing a root-mean-square (RMS) output. For instance, an example accelerometer includes a motion sensor, such as a microelectromechanical systems (MEMS) device, and an application-specific integrated circuit (ASIC). The motion sensor (e.g., the MEMS device) includes a structure (e.g., capacitive structure) having an attribute (e.g., capacitance) that is configured to change in response to acceleration of an object. The ASIC is configured to determine acceleration of the object based at least in part on changes in the attribute of the structure. The ASIC includes analog circuitry, an analog-to-digital converter (ADC), and RMS firmware. The analog circuitry is configured to measure the changes in the attribute of the structure and to generate analog signals that represent the changes in the attribute. The ADC is configured to convert the analog signals to digital signals. The RMS firmware is configured to perform a RMS calculation on a representation of the digital signals to provide an RMS value that represents an amount of the acceleration of the object.

Example techniques described herein have a variety of benefits as compared to conventional techniques for determining acceleration of an object. For instance, the example techniques may perform fewer computations to determine acceleration of such an object. The example techniques may incorporate RMS calculation functionality into a chip on which the motion sensor and ASIC are formed and/or into a semiconductor package that includes both the motion sensor and the ASIC. Accordingly, the example techniques may consume less space (e.g., have a smaller form factor) than conventional acceleration determination systems, which often require an external microprocessor to perform post-processing of the raw data generated by an accelerometer therein. The example techniques may operate at a relatively lower power than a conventional acceleration determination system. For instance, computers that perform more complex calculations and consume more power than a single chip is capable of handling are often used to perform calculations for determining acceleration of an object. The example techniques need not necessarily communicate as much information (e.g., over a communication bus) to a microprocessor that is external to a chip on which the accelerometer is formed, as compared to conventional acceleration determination systems. For instance, information that is not desired may be filtered out before the remaining (i.e., desired) information is communicated externally from the chip. Some example techniques utilize a finite impulse response (FIR) filter to reduce a number of frequencies that are taken into consideration to generate an RMS value that represents acceleration of an object.

The example techniques may be capable of representing acceleration of an object with a higher resolution than conventional acceleration determination systems. For instance, if outputs of a FIR filter in the digital filter are n-bits wide, some of the internal calculations may be wider than n bits. The example techniques may introduce less quantization noise and/or calculation error into processed data than conventional acceleration determination systems. The example techniques may generate more data from which to determine acceleration of an object than conventional acceleration determination systems. The data path of the accelerometer may have a fixed width and depending on the corner frequency of each filter therein, the respective filter may not need the full fixed width. For instance, if the corner frequency of a filter is on the order of ½600 of the sample rate, the full width of the data path may be needed; however, if the filter has a relatively higher bandwidth, the filter may have excess bits for that bandwidth. Having the extra bits may enable the filter to perform calculations with a higher precision. The example techniques may enable a user to configure filters in the accelerometer to a greater extent than a conventional accelerometer. For instance, the accelerometers described herein may enable a user to select values for coefficients of filters in the accelerometer, rather than merely selecting from a fixed number of pre-defined filter responses. The filters may be configurable to narrow the frequency range of interest.

Example accelerometers described herein may be capable of outputting RMS values directly. For example, the output of an accelerometer may be a root-mean-square (RMS) broadband acceleration value. An example accelerometer may include a MEMS device, analog circuitry that is used to directly measure the MEMS device, and a component (e.g., firmware, software, and/or hardware circuitry) that is used to determine the RMS values. The component may be integrated on the same ASIC as the analog circuitry and/or in the same semiconductor package as the analog circuitry.

Traditionally, accelerometers output an indication of acceleration of a device in a transient type of way. For example, if the device is vibrating, a sinusoidal wave may be generated, representing the vibrations. A representation of the sinusoidal wave may be fed into a processor for further processing, which may require substantial power and time. No conventional accelerometers output a single RMS value to represent the amount of vibration. Example accelerometers described herein may incorporate all the filters and the mathematical calculation functionality needed to output a single value for representing the amount of vibration of the device (e.g., in a single chip).

FIG. 1 is a block diagram of an example accelerometer 100 that has an RMS output in accordance with an embodiment described herein. As shown in FIG. 1, accelerometer 100 includes a motion sensor, such as a microelectromechanical systems (MEMS) device 102, and an application-specific integrated circuit (ASIC) 104. The MEMS device 102 includes a structure (e.g., capacitive structure) 106 having an attribute (e.g., capacitance) that is configured to change in response to acceleration of an object. The ASIC 104 is configured to determine acceleration of the object based at least in part on changes in the attribute of the structure 106. The ASIC 104 includes analog circuitry 108, an analog-to-digital converter (ADC) 110, and firmware 112. The analog circuitry 108 is configured to measure the changes in the attribute of the structure 106 and to generate analog signals 118 that represent the changes in the attribute. The ADC 110 is configured to convert the analog signals 118 to digital signals 120. The firmware 112 includes RMS firmware 116. It will be recognized that the firmware 112 may include logic that is hard-coded onto the accelerometer 100 so that the accelerometer 100 runs more efficiently. The RMS firmware 116 is configured to perform a root-mean-square (RMS) calculation on a representation of the digital signals 120 to provide an RMS value 114 that represents an amount of the acceleration of the object. The representation of the digital signals 120 may include (e.g., be) an unaltered version of the digital signals 120, a filtered version of the digital signals, an average of the digital signals 120 (e.g., a rolling average, a down-sampled average, a down-sampled rolling average) of the digital signals 120, or other suitable representation of the digital signals 120. The RMS value 114 may or may not be filtered.

In an example embodiment, the RMS firmware 116 is configured to perform multiple RMS calculations on the representation of the digital signals 120 to provide multiple respective RMS values that represent respective amounts of the acceleration of the object with respect to respective frequencies. The RMS calculations can be implemented as consecutive RMS calculations, sliding RMS calculations, or resynchronized RMS calculations, though the scope of the example embodiments is not limited in this respect.

In another example embodiment, the RMS firmware 116 is configured to generate an interrupt signal based at least in part on the RMS value 114 reaching a threshold. For example, the RMS firmware 116 may generate such an interrupt signal based at least in part on the RMS value 114 being less than or equal to a first threshold. In another example, the RMS firmware 116 may generate such an interrupt signal based at least in part on the RMS value 114 being greater than or equal to a second threshold. For instance, the second threshold may be greater than the first threshold.

It will be recognized that RMS calculations mentioned above with reference to the RMS firmware 116 may be replaced with variance calculations.

In an example embodiment, the analog circuitry 108, the ADC 110, and the firmware 112 are implemented on a common (e.g., single) semiconductor chip. In other example embodiments, the MEMS device 102 and the ASIC 104 are implemented on a common semiconductor chip, i.e., on a common substrate, and/or included in a single package, as shown by dashed box 105.

The accelerometer 100 may be incorporated into any suitable type of acceleration determination system (e.g., a vibration sensor). For example, the accelerometer 100 may be incorporated into a vibration sensor to monitor health of a machine (e.g., a motor). In accordance with this example, the extent to which the machine vibrates, as measured by the accelerometer 100, may indicate a time at which the machine is likely to fail (e.g., stop operating). A vibration sensor that includes the accelerometer 100 may be used in applications in which the frequency domain acceleration is of more interest than the time domain acceleration, for example. The vibration sensor may be configured to use internal filters to be sensitive to specific frequency ranges. For instance, the accelerometer 100 may report the RMS value of the vibration in the configured range.

Figure 2:
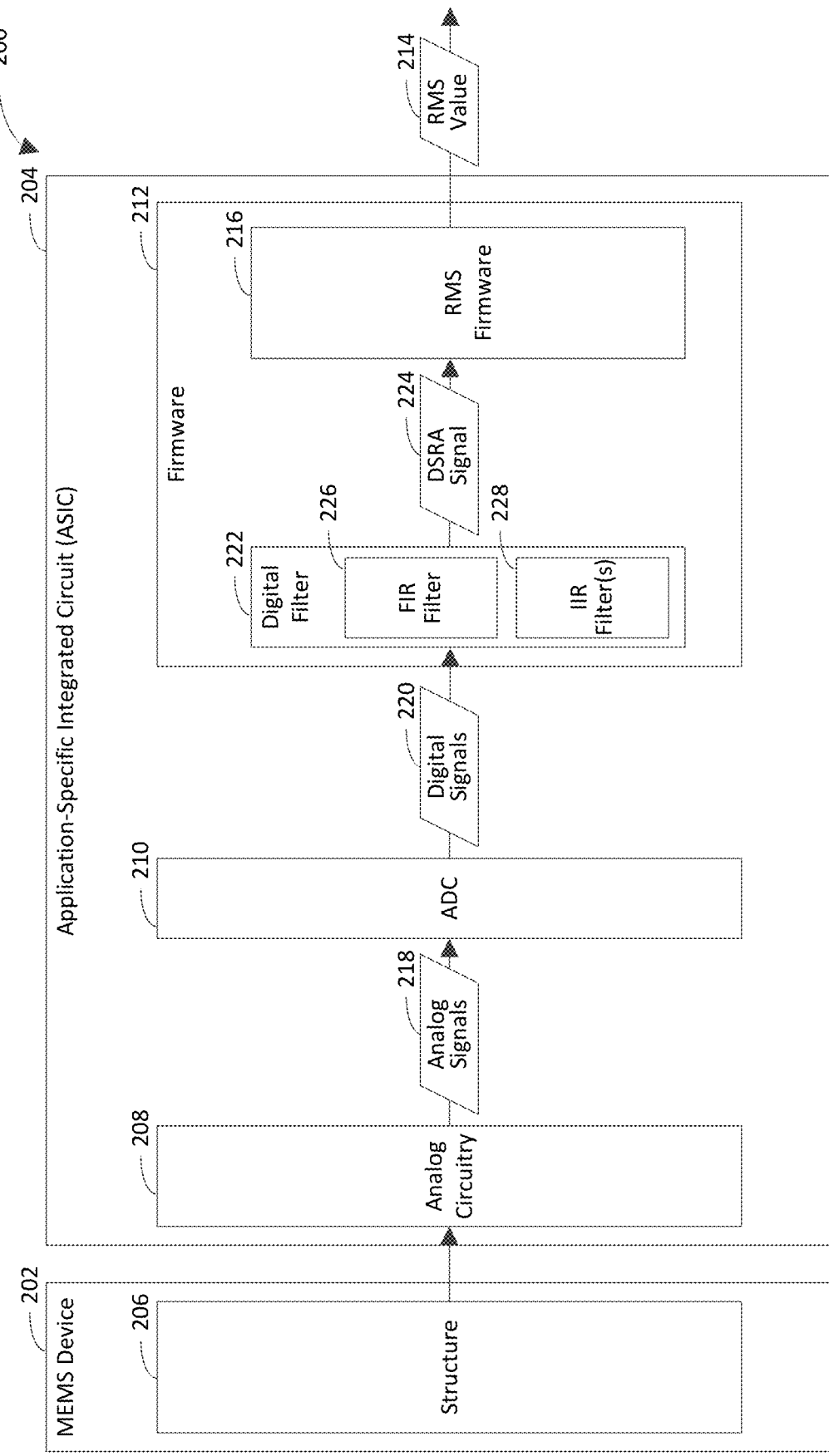
Figure 3:
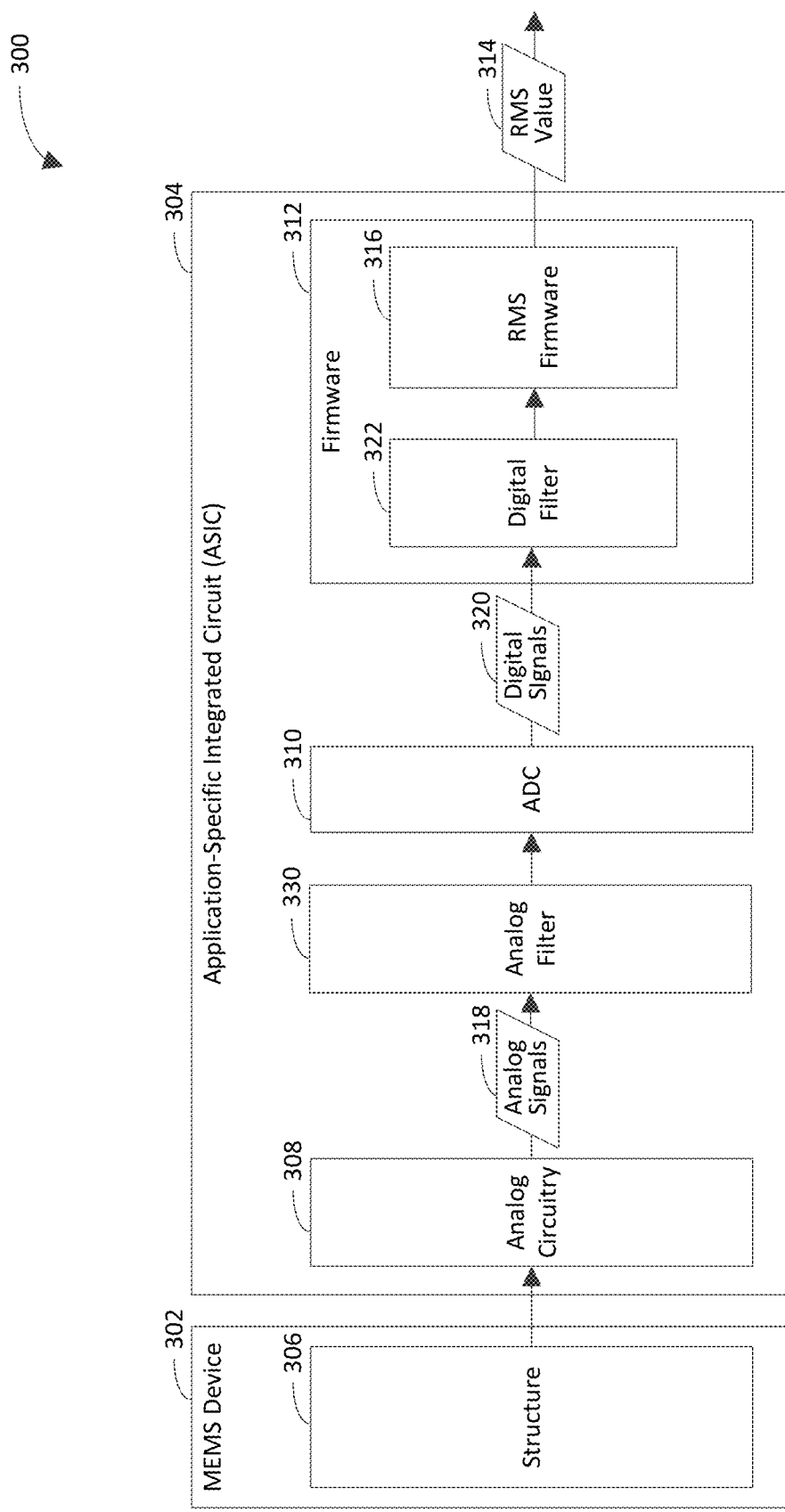

It will be recognized that accelerometer 100 may not include all of the components shown in FIG. 1. Furthermore, accelerometer 100 may include component(s) in addition to or in lieu of those shown in FIG. 1. For instance, the accelerometer 100 may include analog and/or digital filter(s). By including one or more filters, the accelerometer 100 may be capable of combining filtering and calculating a series of interval RMS values over a slice of time to directly output a broad-band value of the acceleration of the object. FIG. 2 shows an accelerometer 200 that includes a digital filter 222 for illustrative purposes. FIG. 3 shows an accelerometer 300 that includes an analog filter 330 for illustrative purposes. FIGS. 2 and 3 are described in further detail below.

As shown in FIG. 2, the accelerator includes a MEMS device 202 and an ASIC 204. The MEMS device 202 includes a structure 206. The ASIC 204 includes analog circuitry 208, an ADC 210, and firmware 212. The MEMS device 202, structure 206, analog circuitry 208, and ADC 210 are operable in a manner similar to the MEMS device 102, structure 106, analog circuitry 108, and ADC 110 of FIG. 1. The firmware 212 includes a digital filter 222 and RMS firmware 216. The digital filter 222 is configured to filter the digital signals to provide filtered digital signals for processing by the RMS firmware 216. For example, the digital filter 222 may be configured to sample the digital signals at a sampling frequency that is greater than or equal to an output data rate (ODR) of the RMS firmware 216. In another example, the digital filter 222 may be configured to sample the digital signals at a sampling frequency that is greater than or equal to an integer multiple of the ODR of the RMS firmware 216. For instance, the integer multiple may be 2, 3, 4, 5, or 6. The RMS firmware 216 is configured to perform a RMS calculation on the filtered digital signals to provide the RMS value 214, which represents the amount of the acceleration of the object.

The digital filter 222 is shown in FIG. 2 to include a finite impulse response (FIR) filter 226 and infinite impulse response (IIR) filter(s) 228 for non-limiting, illustrative purposes. It will be recognized that the digital filter 222 need not necessarily include the FIR filter 226 and/or the IIR filter(s) 228. The FIR filter 226 is configured to down-sample a rolling average of the digital signals 220 to provide a down-sampled rolling average (DSRA) signal 224. The IIR filter(s) 228 are configured to modify a frequency response of the digital filter 222. For instance, the IIR filter(s) 228 may modify a shape of the DSRA signal 224. If the FIR filter 226 and the IIR filter(s) 228 are included in the digital filter 222, the RMS firmware 216 is configured to perform a RMS calculation on the DSRA signal 224 to provide the RMS value 214.

In an example embodiment, the IIR filter(s) 228 include at least one Butterworth filter, at least one Bessel filter, and/or at least one Chebyshev filter. Each filter that is included in the IIR filter(s) 228 may be any suitable order (e.g., first order, second order, or third order). Each filter may be a band-pass filter, a band-reject filter (a.k.a. band-stop filter), a high-pass filter, a low-pass filter, or any combination thereof. For example, the IIR filter(s) 228 may include a bandpass filter configured to allow frequencies that are included in a designated (e.g., predetermined) frequency band to pass (e.g., and to block frequencies that are not included in the designated frequency band. In another example, the IIR filter(s) 228 may include a band-reject filter configured to block frequencies that are included in a designated (e.g., predetermined) frequency band (e.g., and to allow frequencies that are not included in the designated frequency band to pass).

In another example embodiment, the IIR filter(s) 228 include multiple IIR filters. In accordance with this embodiment, each of the IIR filters has a set of user-programmable coefficients that are capable of having multiple sets of values. In further accordance with this embodiment, a first set of values causes a first IIR filter to be configured as a Butterworth filter. In further accordance with this embodiment, a second set of values causes a second IIR filter to be configured as a Bessel filter.

In an example embodiment, the FIR filter 226 is configured to sample the rolling average of the digital signals 220 at a sampling frequency that is greater than or equal to an output data rate of the RMS firmware 216. In another example embodiment, the FIR filter 226 is configured to sample the rolling average of the digital signals 220 at a sampling frequency that is greater than or equal to two times the output data rate of the RMS firmware 216. In yet another example embodiment, the FIR filter 226 is configured to sample the rolling average of the digital signals 220 at a sampling frequency that is greater than or equal to four times the output data rate of the RMS firmware 216.

It will be recognized that any of the filtering functionality described above with reference to the digital filter 222 may be performed by an analog filter. For instance, the accelerometer 300 of FIG. 3 includes a MEMS device 302 and an ASIC 304. The MEMS device 302 includes a structure 306. The ASIC 304 includes analog circuitry 308, an analog filter 330, an ADC 310, and firmware 312. The MEMS device 302, structure 306, analog circuitry 308, and ADC 310 are operable in a manner similar to the MEMS device 102, structure 106, analog circuitry 108, and ADC 110 of FIG. 1. The ASIC 304 further includes an analog filter 330 coupled between the analog circuitry 308 and the ADC 310. The analog filter 330 is configured to filter the analog signals 318 that are provided by the analog circuitry 308. For instance, any of the filtering operations that the digital filter 222 of FIG. 2 may perform on the digital signals 220 may be performed on the analog signals 318 by the analog filter 330. The firmware 312 is shown to include a digital filter 322 and RMS firmware 316 for non-limiting, illustrative purposes. It will be recognized that the firmware 312 need not necessarily include the digital filter 322. The digital filter 322 may be configured to perform any of the filtering operations that are described above with reference to the digital filter of FIG. 2. The RMS firmware 316 may be configured to perform any of the operations that are described above with reference to the RMS firmware 116 of FIG. 1 and/or the RMS firmware 216 of FIG. 2.

Figure 4:
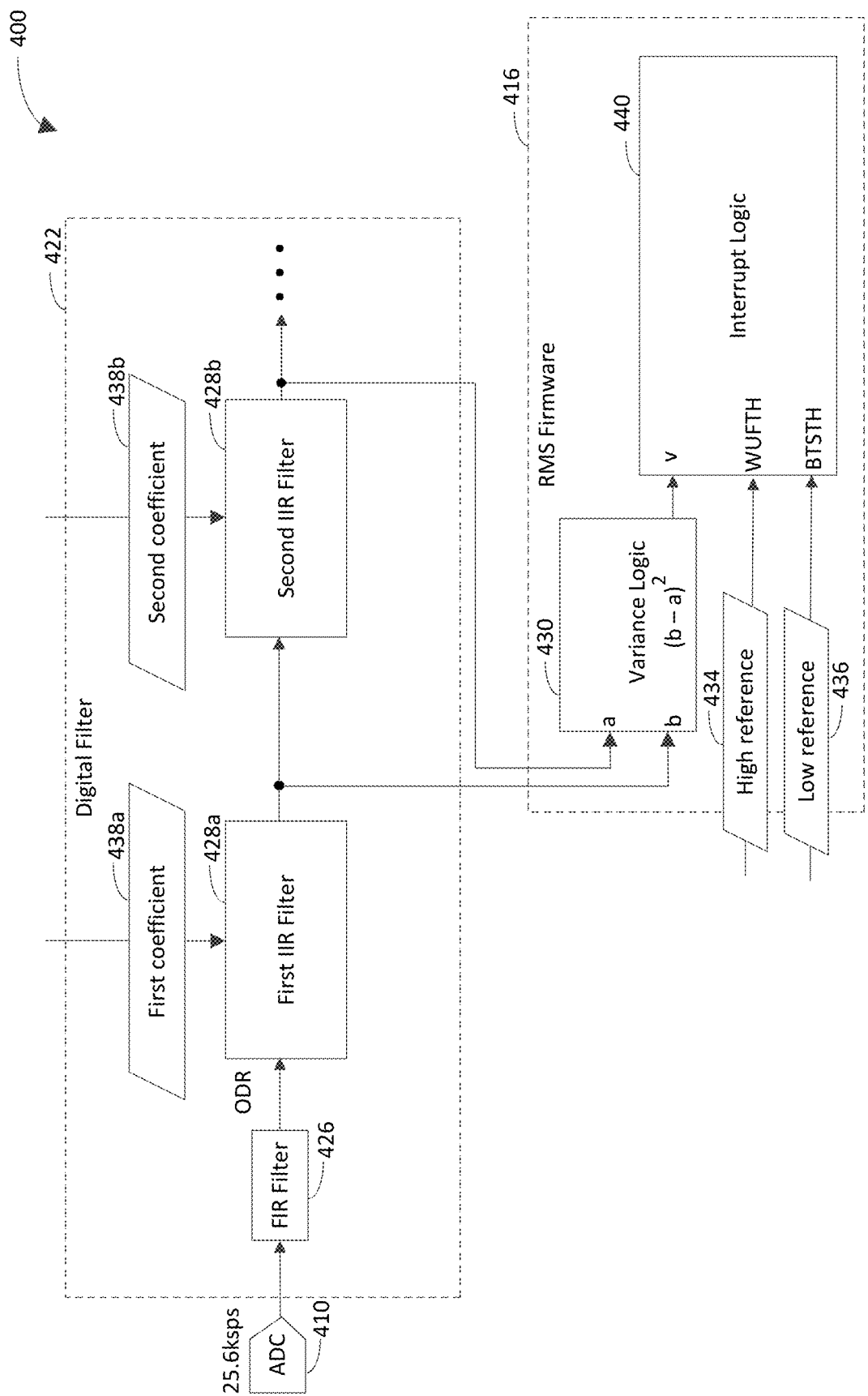

FIG. 4 is a block diagram of another example accelerometer 400 that has an RMS output in accordance with an embodiment described herein. As shown in FIG. 4, accelerometer 400 includes an ADC 410, a digital filter 422, and RMS firmware 416. The digital filter 422 includes a FIR filter 426, a first IIR filter 428a, and a second IIR filter 428b. The ADC 410 and the FIR filter 426 are operable in a manner similar to the ADC 210 and the FIR filter 226 described above with reference to FIG. 2. The first IIR filter 428a is defined by first coefficients 438a. The second IIR filter 428b is defined by second coefficients 438b. Each of the first and second IIR filters 428a and 428b may be any suitable type of filter (e.g., a Bessel filter, a Chebyshev filter, or a Butterworth filter). For instance, a Butterworth filter may be chosen to provide a relatively quick cutoff at the cutoff frequency. A Bessel may be chosen to provide a phase response that is substantially linear in the passband. The accelerometer 400 is shown in FIG. 4 to include two IIR filters 428a and 428b for non-limiting, illustrative purposes. By knowing the first and second coefficients 438a and 438b and the input data rate (IDR) of the first and second IIR filters 428a and 428b, the corner frequencies of the first and second IIR filters 428a and 428b may be set. The IDR of the first and second IIR filters 428a and 428b is the same as the output data rate (ODR) of the FIR filter 426. The ODR of the FIR filter 426 is the data rate at which data is generated by the FIR filter 426. It will be recognized that the accelerometer 400 may include any suitable number of filters (e.g., 0, 1, 2, 3, 4, 5, 6, and so on). The first and second IIR filters 428a and 428b may be incorporated into the FIR filter 426, though the scope of the example embodiments is not limited in this respect.

Each of the first and second IIR filters 428a and 428b may have any suitable number of poles. For instance, each of the first and second IIR filters 428a and 428b may be a single-pole filter, a double-pole filter, etc. In one example, the first IIR filter 428a may be a double-pole filter and the second IIR filter 428b may be a single-pole filter, or vice versa. The number of poles is a design consideration that depends on the desired performance of the accelerometer 400. A higher number of poles provides relatively higher frequency isolation; whereas, a lower number of poles provides a relatively smaller form factor, which may lead to greater size optimization.

The RMS firmware 416 includes variance logic 430 and interrupt logic 440. The variance logic 430 is configured to calculate the variance "v" associated with a first input "a" and a second input "b". The first and second inputs are shown in FIG. 4 to be coupled to an input of the second IIR filter 428b and an output of the second IIR filter 428b for non-limiting, illustrative purposes. Each of the first and second inputs may be coupled to any suitable node in the accelerometer 400 (e.g., an output of the FIR filter 426, an input of the first IIR filter 428a, an output of the first IIR filter 428a, an input of the second IIR filter 428b, an output of the second IIR filter 428b, and so on). The interrupt logic 440 compares the variance "v" to a high reference 434, which corresponds to a "wake up" threshold (WUFTH), and a low reference 436, which corresponds to a "back to sleep" threshold (BTSTH). The interrupt logic 440 is configured to generate an interrupt based at least in part on the variance "v" is greater than the high reference 434 or less than the low reference 436. The variance "v" being greater than the high reference 434 indicates that the vibration of the object is greater than the WUFTH. The variance "v" being less than the low reference 436 indicates that the vibration of the object is less than the BTSTH.

If the accelerometer 400 down-samples digital signals that are provided by the ADC 410, the accelerometer 400 is configurable to utilize additional bit(s) if the down-sample rate needs a greater range. If the ODR is less than a threshold rate (e.g., 0.78 Hertz (Hz)), an enable/disable bit associated with the digital filter 422 may be repurposed so that the extra bit may be utilized.

Figure 5:
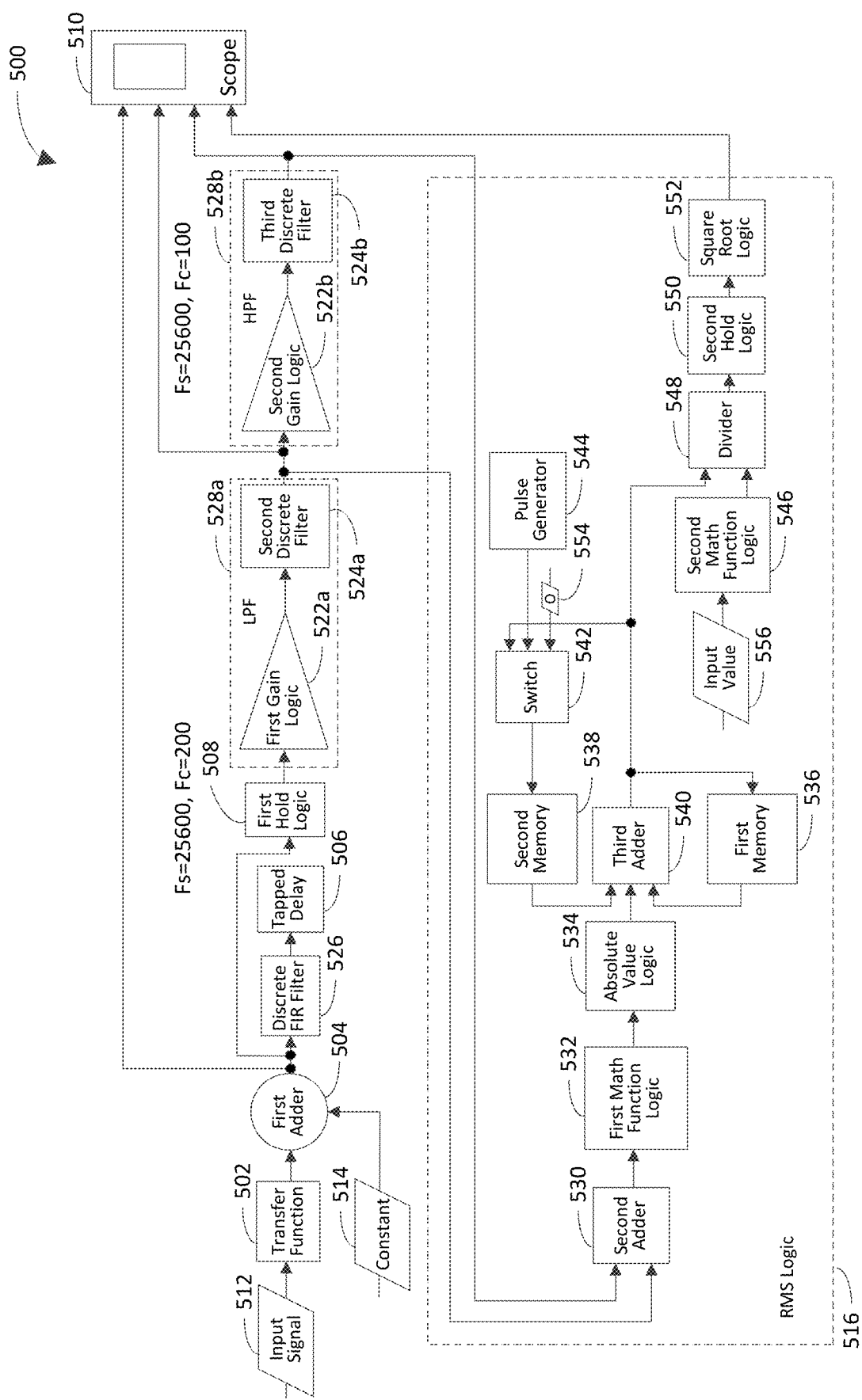
FIG. 5 is a block diagram of an example model of the accelerometer shown in FIG. 2 in accordance with an embodiment described herein.

FIG. 5 is a block diagram of an example model 500 of the accelerometer 400 shown in FIG. 4 in accordance with an embodiment described herein. The model 500 includes a transfer function 502, a first adder 504, a discrete FIR filter 526, a tapped delay 506, first hold logic 508, a low pass filter (LPF) 528a, a high pass filter (HPF) 528b, a scope 510, and RMS logic 516. The transfer function 502 is configured to operate on an input signal 512. For instance, the input signal 512 may be a chirp signal, and the transfer function 502 may be represented as num(s)/den(s). The first adder 504 adds an output of the transfer function 502 and a constant 514. The discrete FIR filter 526 filters the output of the first adder 504, which leads to the tapped delay 506. The first hold logic 508 holds the output of the first adder 504, which is then provided to the LPF 528a. The LPF 528a includes the first gain logic 522a and the second discrete filter 524a. The first gain logic 522a amplifies the output of the first hold logic 508, which is then filtered by the second discrete filter 524a. The HPF 528b includes the second gain logic 522b and the third discrete filter 524b. The second gain logic 522b amplifies the output of the LPF 528a, which is then filtered by the third discrete filter 524b.

The RMS logic includes a second adder 530, first math function logic 532, absolute value logic 534, first memory, 536, second memory 538, a third adder 540, a switch 542, a pulse generator 544, second math function logic 546, a divider 548, second hold logic 550, and square root logic 552. The second adder 530 adds the output of the LPF 528a and the output of the HPF 528b. The first math function logic 532 calculates the square of the output of the second adder 530. The absolute value logic 534 calculates the absolute value of the output of the first math function logic 532. The third adder 540 adds the output of the absolute value logic 534, the output of the first memory 536, and the output of the second memory 538. The first memory 536 stores the output of the third adder 540. The second memory 538 stores the output of the switch 542. The pulse generator 544 generates pulses that control operation of the switch 542. The switch 542 is turned on for a duration of each pulse and turned off between the pulses. Other inputs to the switch 542 include the output of the third adder 540 and a constant 554 that is equal to zero. The second math function logic 546 calculates the square of the input value 556. The divider 548 divides the output of the third adder 540 by the output of the second math function logic 546. The second hold logic 550 holds the output of the divider 548, which is then provided to the square root logic 552. The square root logic 552 calculates the square root of the output of the second hold logic 550. The scope 510 receives the output of the first adder 504, the output of the LPF 528a, the output of the HPF 528b, and the output of the square root logic 552 for viewing by a user of the model 500.

Figure 6:
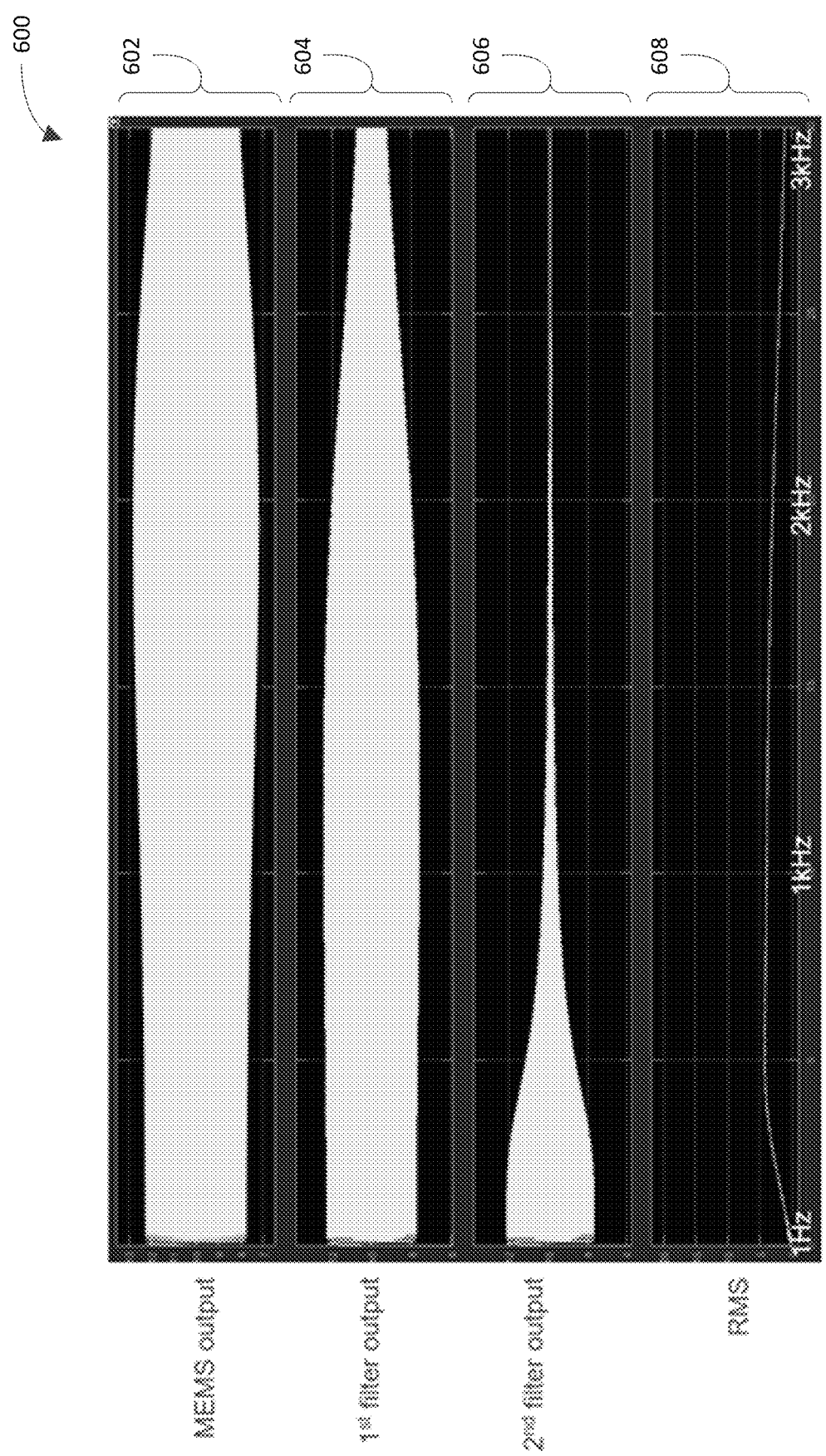
FIG. 6 shows plots of example output signals of respective components of an accelerometer in accordance with embodiments described herein.

FIG. 6 shows plots 600 of example output signals 602, 604, 606, and 608 of respective components of an accelerometer in accordance with embodiments described herein. Output signal 602 represents example changes in an attribute of a structure in a MEMS device (e.g., structure 106 in MEMS device 102 of FIG. 1). For instance, the output signal 602 may correspond to the output of the first adder 504 shown in FIG. 5. Output signal 604 represents an example output of a first filter (e.g., first filter 428a of FIG. 4 or LPF 528a of FIG. 5). Output signal 606 represents an example output of a second filter (e.g., second filter 428b of FIG. 4 or HPF 528b of FIG. 5). Output signal 608 represents an example output of RMS firmware (e.g., RMS firmware 116 of FIG. 1 or RMS logic 516 of FIG. 5). For instance, the output signal 608 may represents a series of RMS values corresponding to respective frequencies.

Figure 7A:
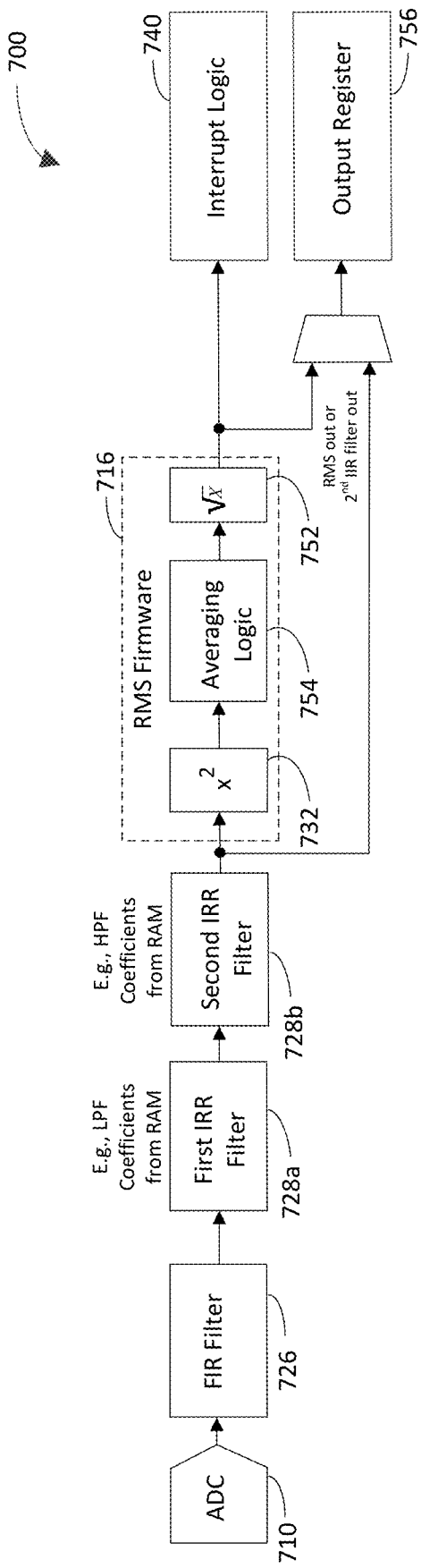
FIGS. 7A-7B show block diagrams of example accelerometers having respective modes of operation in accordance with embodiments described herein.
Figure 7B:
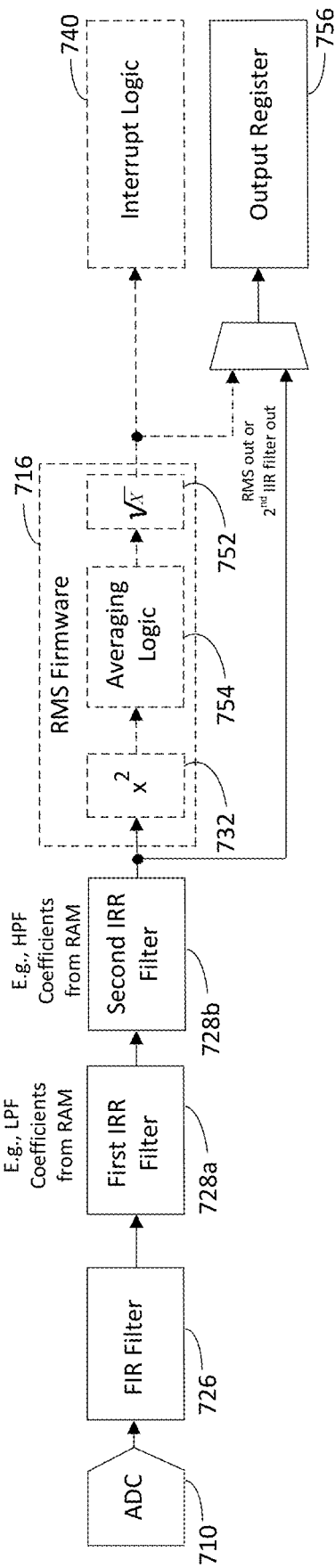

FIGS. 7A and 7B show block diagrams of example accelerometers 700 and 750 having respective modes of operation in accordance with embodiments described herein. As shown in FIGS. 7A and 7B, each of the accelerometers 700 and 750 includes an ADC 710, a FIR filter 726, a first IIR filter 728a, a second IIR filter 728b, RMS firmware 716, interrupt logic 740, and an output register 756. RMS firmware 716 includes squaring logic 732, averaging logic 754, and square-root logic 752. The ADC 710, the FIR filter 726, the first IIR filter 728a, the second IIR filter 728b, and the interrupt logic 740 are operable in a manner similar to the ADC 410, the FIR filter 426, the first IIR filter 428a, the second IIR filter 428b, and the interrupt logic 440 of FIG. 4. The squaring logic 732 squares each received data point to provide a squared data point. The averaging logic 754 averages a designated number of squared data points that are received from the squaring logic 732 to provide an average value. The square-root logic 752 performs a square root on the average value to provide an RMS value. The output register 756 stores the output of the RMS firmware 716 or the output of the second IIR filter 728b, depending on the mode of operation. For example, in the accelerometer 700 of FIG. 7A, the output register 756 is configured to store the output of the RMS firmware 716 in accordance with a first mode of operation. In the accelerometer 750 of FIG. 7B, the output register 756 is configured to store the output of the second IIR filter 728b in accordance with a second mode of operation.

Figure 8:
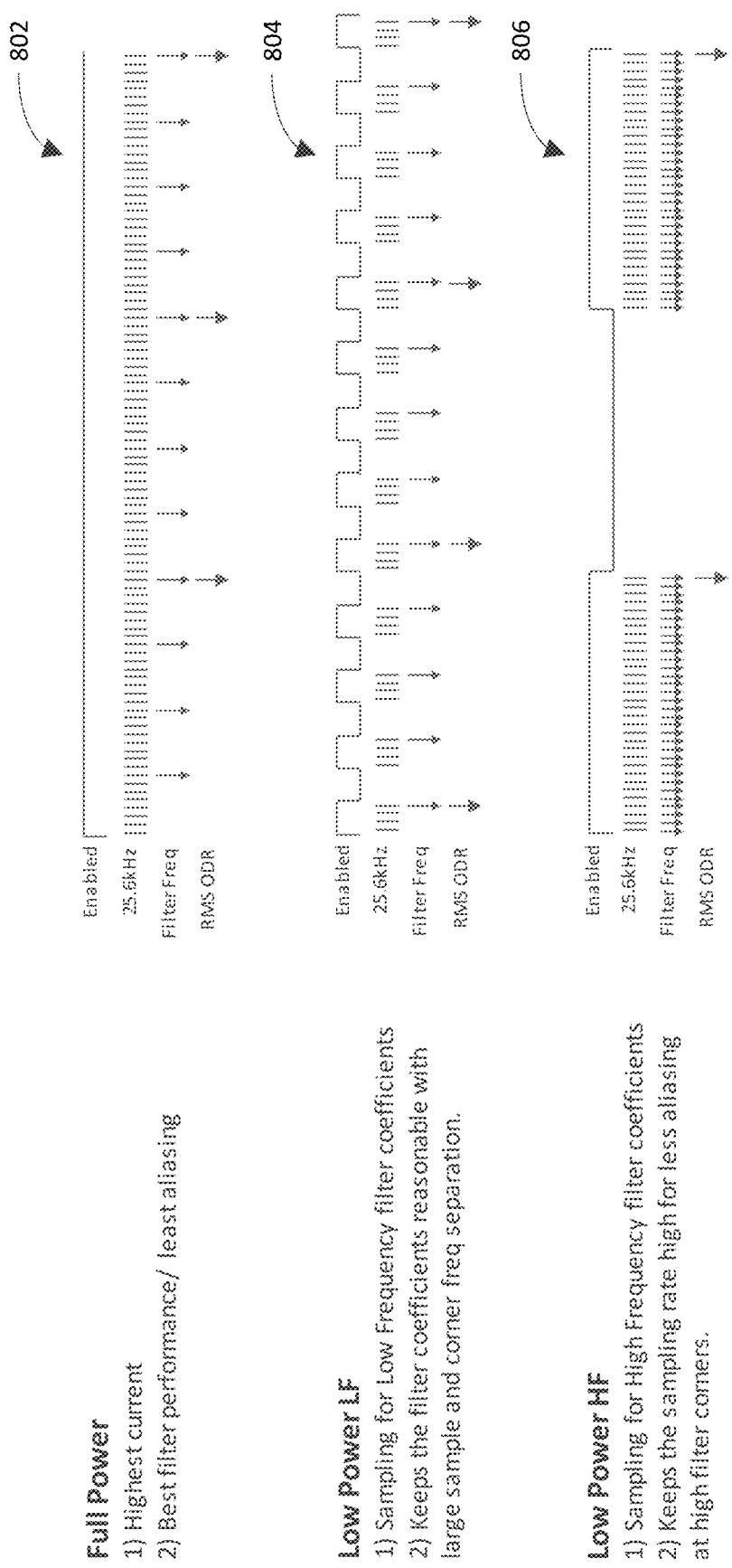
FIG. 8 shows example timing diagrams of an accelerometer for respective modes of operation in accordance with embodiments described herein.
Figure 9:
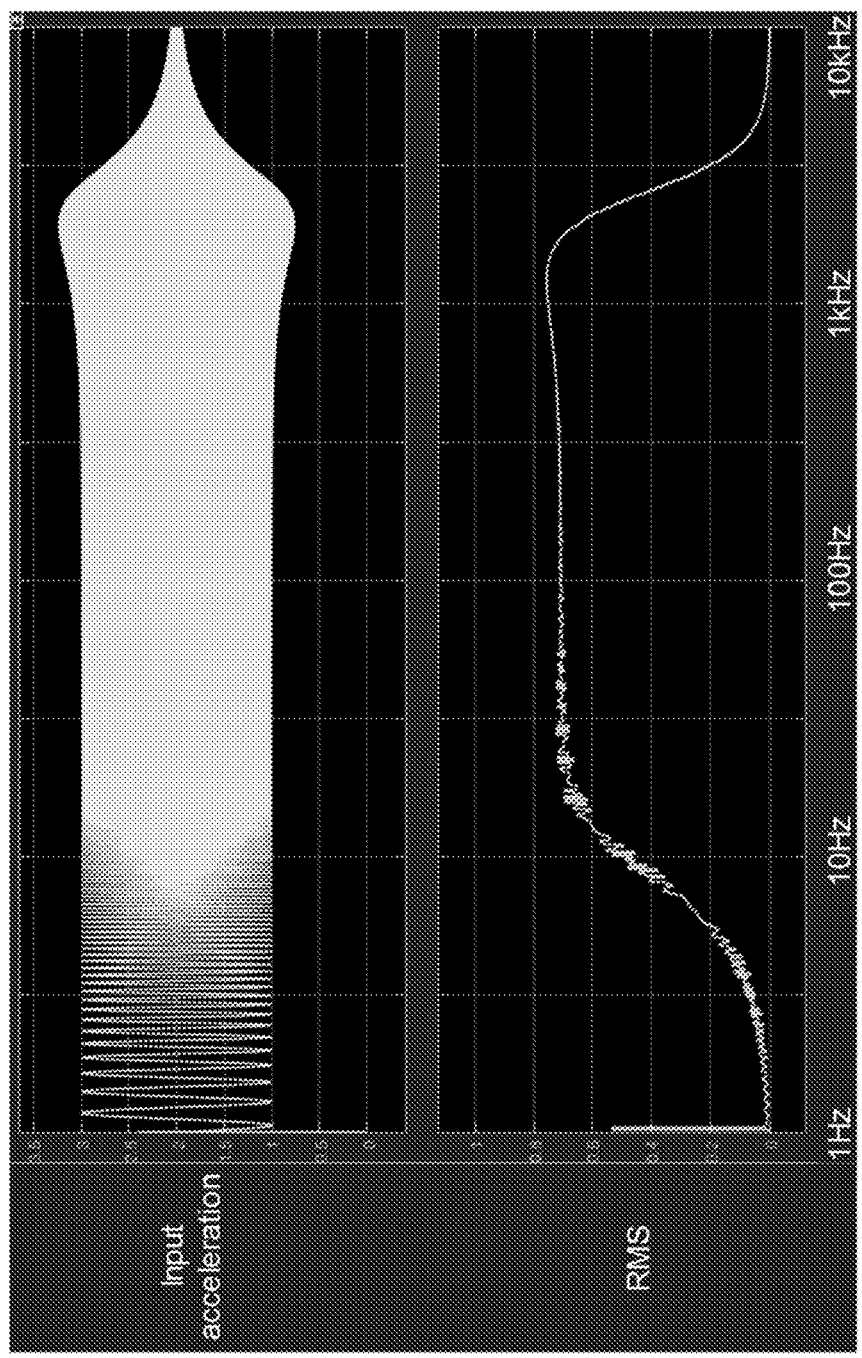
FIGS. 9-12 show example plots of input acceleration versus RMS output for respective modes of operation in accordance with embodiments described herein.

FIG. 8 shows example timing diagrams 802, 804, and 806 of an accelerometer for respective modes of operation in accordance with embodiments described herein. The accelerometer includes an ADC, a digital filter, and RMS firmware. The frequency of the digital signals that are provided by the ADC is 25.6 kHz for each of the timing diagrams 802, 804, and 806 for non-limiting, illustrative purposes.

The first timing diagram 802 corresponds to a full power mode of operation of the accelerometer. The full power mode may provide the highest current and the best filter performance (i.e., least aliasing) of the modes discussed with regard to FIG. 8. In the first timing diagram 802, the digital filter is continuously enabled, corresponding to a duty cycle of 100% for the control signal that is configured to control operation of the digital filter. In this mode, the digital filter samples the digital signals at ⅛th of the frequency of the digital signals (i.e., (25.6 kHz)/8=3.2 kHz). Accordingly, the "filter frequency" of the digital filter is said to be 3.2 kHz. In this mode, the ODR of the RMS firmware is ¼th of the filter frequency (i.e., (3.2 kHz)/4=0.8 kHz=800 Hz).

The second timing diagram 804 corresponds to a low power low frequency mode of operation of the accelerometer. The low power low frequency mode may provide sampling for relatively low frequency filter coefficients. This mode may keep the filter coefficients reasonable with relatively large sample frequency separation and/or corner frequency separation. In the second timing diagram 804, each of the control signal of the digital filter and the filter frequency of the digital filter has a frequency that is ⅛th of the frequency of the digital signals (i.e., (25.6 kHz)/8=3.2 kHz). In this mode, the ODR of the RMS firmware is ¼th of the filter frequency (i.e., (3.2 kHz)/4=0.8 kHz=800 Hz).

The third timing diagram 806 corresponds to a low power high frequency mode of operation of the accelerometer. The low power high frequency mode may provide sampling for relatively high frequency filter coefficients. This mode may keep the sampling rate relatively high for less aliasing at high filter corners. In the third timing diagram 806, each of the control signal and the ODR of the RMS firmware has a frequency that is 1/32nd of the frequency of the digital signals (i.e., (25.6 kHz)/32=0.8 kHz=800 Hz). In this mode, the filter frequency of the digital filter is equal to the frequency of the digital signals (i.e., 25.6 kHz).

Figure 10:
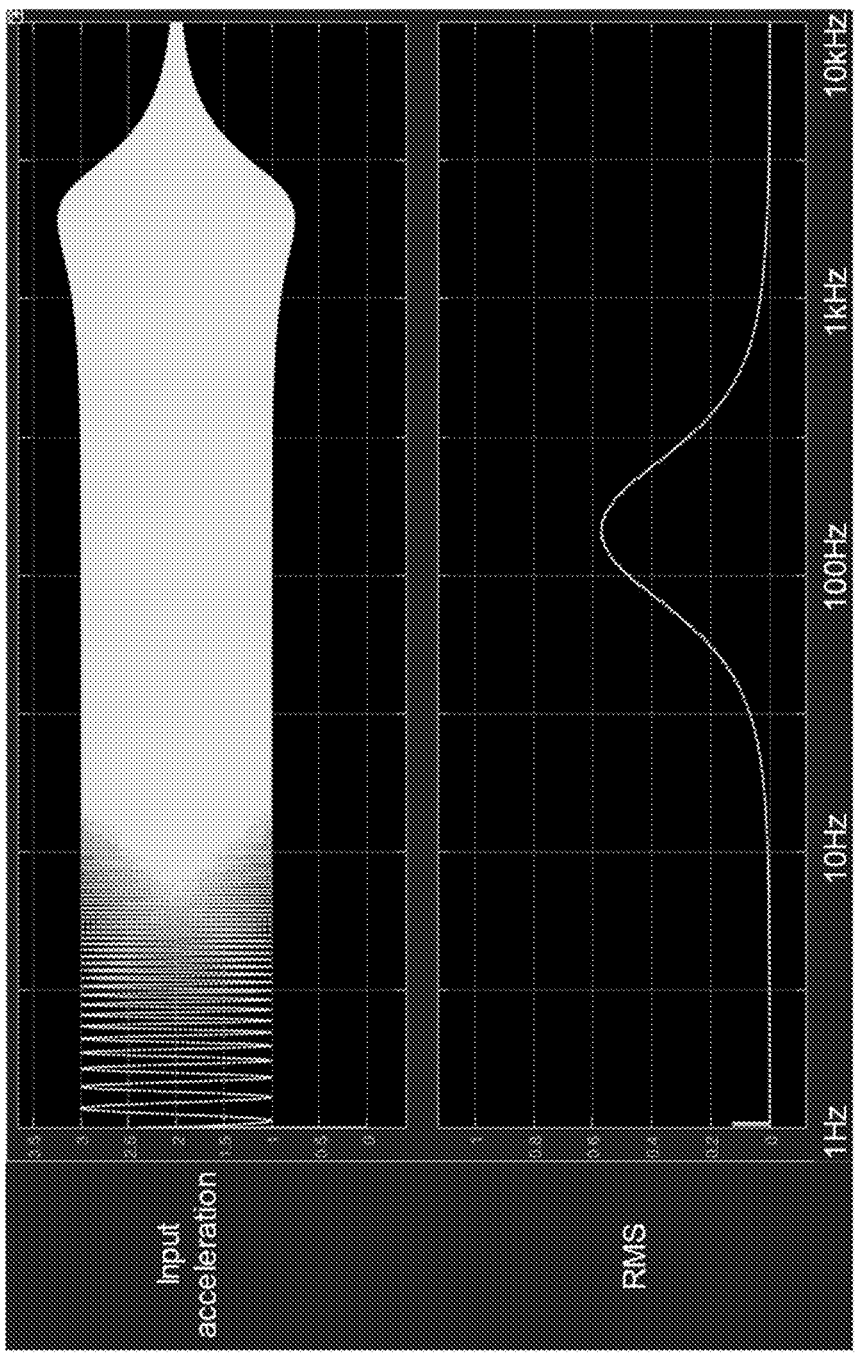
Figure 11:
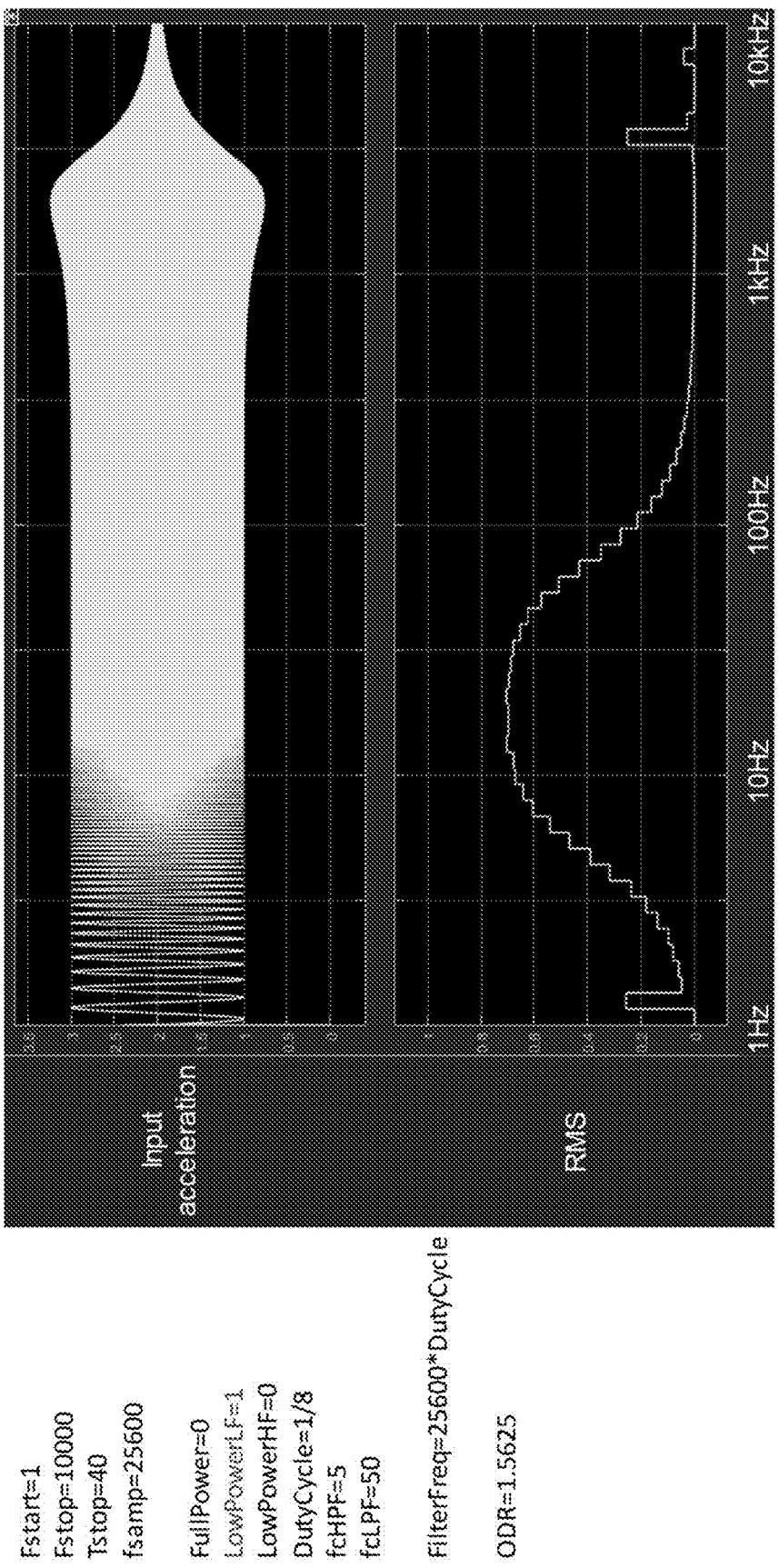
Figure 12:
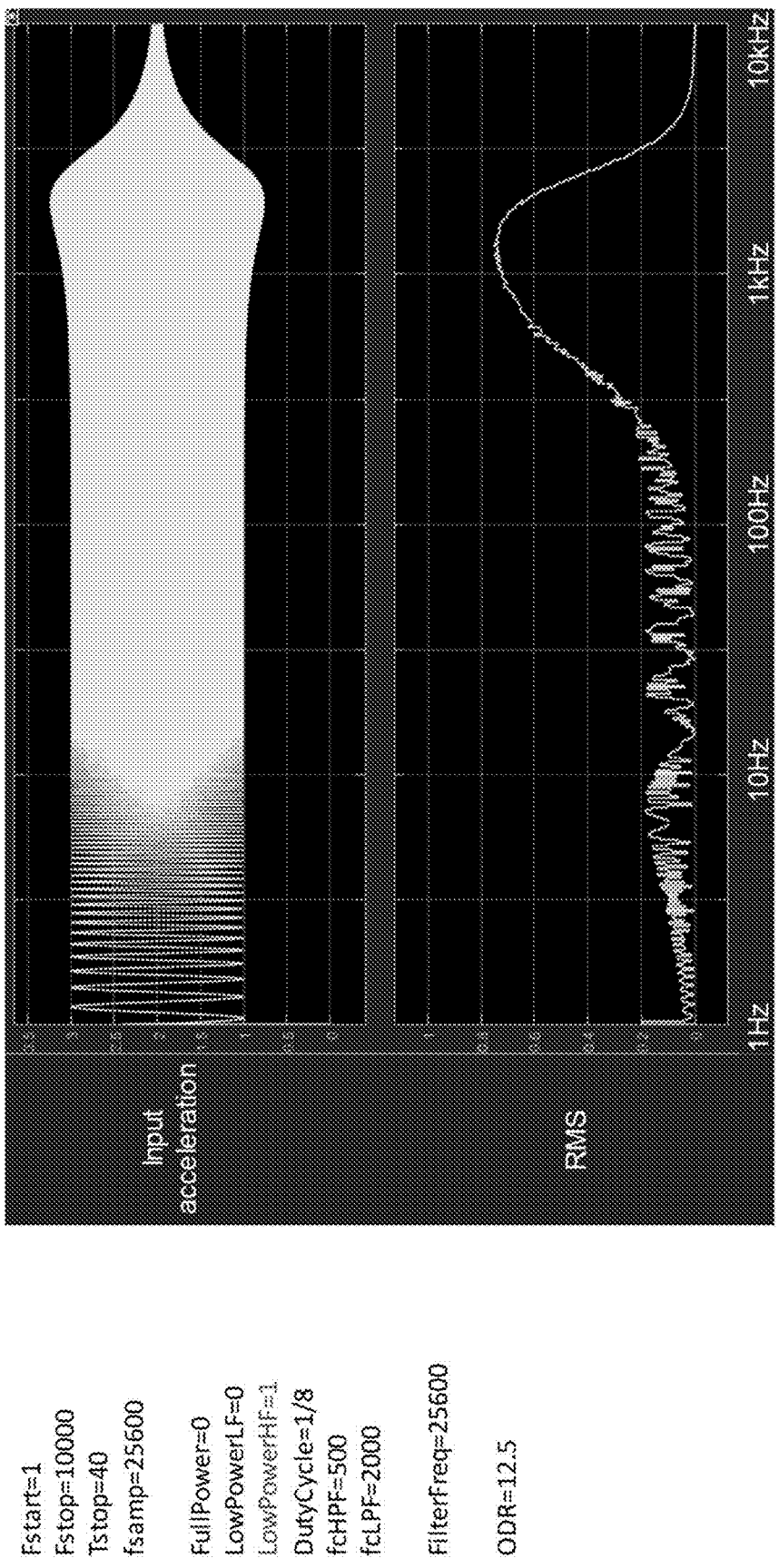

FIGS. 9-12 show example plots 900, 1000, 1100, and 1200 of input acceleration versus RMS output for respective modes of operation in accordance with embodiments described herein. Plots 900 and 1000 correspond to example implementations of the full power mode described above with regard to timing diagram 802 of FIG. 8. Plot 1100 corresponds to an example implementation of the low power low frequency mode described above with regard to timing diagram 804 of FIG. 8. Plot 1200 corresponds to an example implementation of the low power high frequency mode described above with regard to timing diagram 806 of FIG. 8. The input acceleration in each of FIGS. 9-12 may represent the physical vibration of an object. The RMS output for each of FIGS. 9-12 is a series of RMS values corresponding to respective frequencies in the frequency spectrum. The mode of operation depicted by each of FIGS. 9-12 corresponds to a respective set of filter settings that is calibrated to a respective frequency range. For example, in FIG. 9, the corner frequency of the high-pass filter (HPF) is 10 Hz, and the corner frequency of the low-pass filter (LPF) is 2000 Hz. In FIG. 10, the corner frequency of the HPF is 100 Hz, and the corner frequency of the LPF is 200 Hz. In FIG. 11, the corner frequency of the HPF is 5 Hz, and the corner frequency of the LPF is 50 Hz. In FIG. 12, the corner frequency of the HPF is 500 Hz, and the corner frequency of the LPF is 2000 Hz.

FIGS. 13 and 14 show tables 1300 and 1400 of example ports for filtering and RMS functional blocks in an accelerometer (e.g., filters 428a and 428b and RMS firmware 416 in accelerometer 400 of FIG. 4) in accordance with embodiments described herein. The filtering and RMS functional blocks may be configurable. For example, the filtering and RMS functional blocks may include a second-order infinite impulse response (IIR) filter configurable as low-pass only with optional bypass. In accordance with this example, the filtering and RMS functional blocks may further include a second-order IIR filter configurable as either low-pass or high-pass with optional bypass. In further accordance with this example, the filtering and RMS functional blocks may further include an RMS calculation block with configurable window size. In further accordance with this example, the filtering and RMS functional blocks have two configurable outputs.

Figure 15:
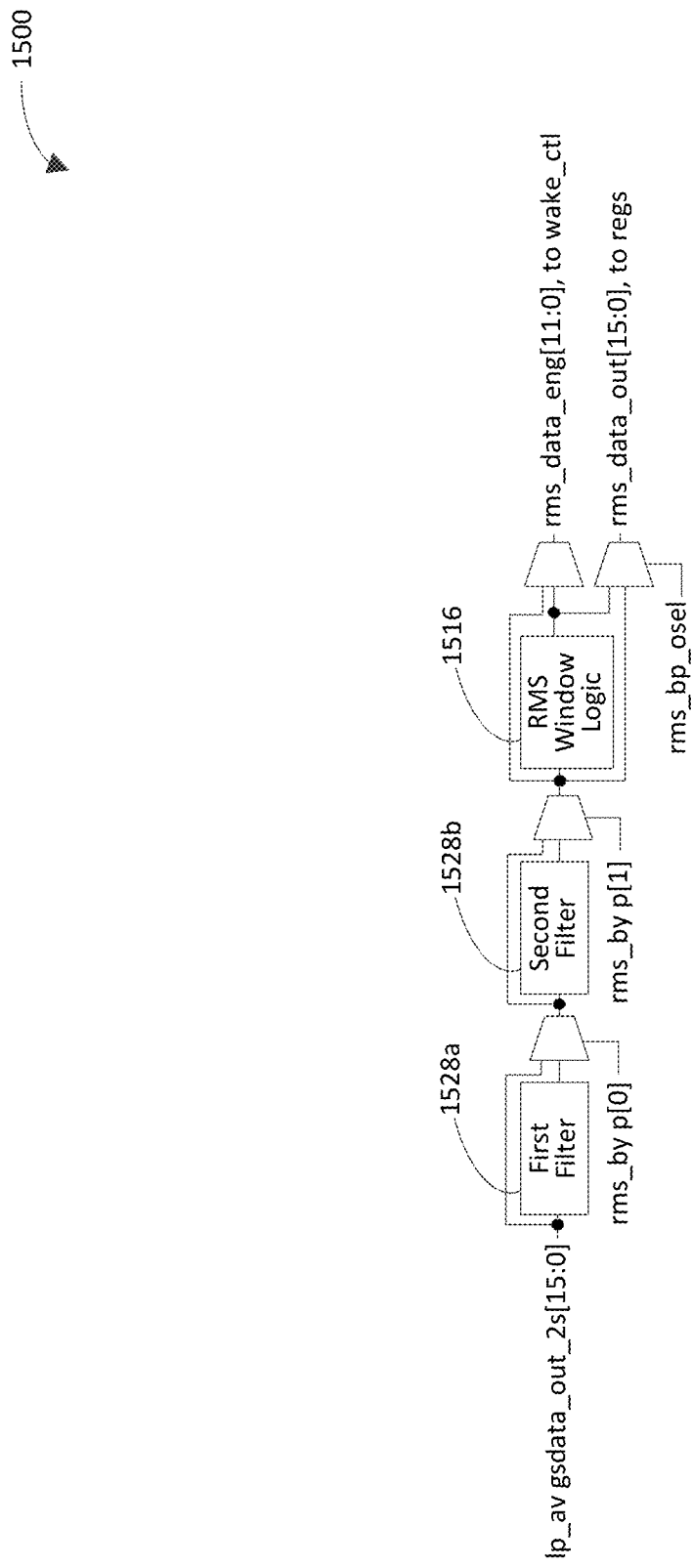
FIG. 15 is a block diagram of the filtering and RMS functional blocks described above with reference to FIGS. 12 and 13 in accordance with an embodiment described herein.

FIG. 15 is a block diagram of the filtering and RMS functional blocks 1500 described above with reference to FIGS. 13 and 14 in accordance with an embodiment described herein. The filtering and RMS functional blocks 1500 include a first filter 1528a, a second filter 1528b, and RMS window logic 1516. The first filter 1528a, the second filter 1528b, and the RMS window logic 1516 may be operable in a manner similar to the first IIR filter 428a, the second IIR filter 428b, and the RMS firmware 416, respectively, which are described above with reference to FIG. 4, though the scope of the example embodiments is not limited in this respect.

Figure 16:
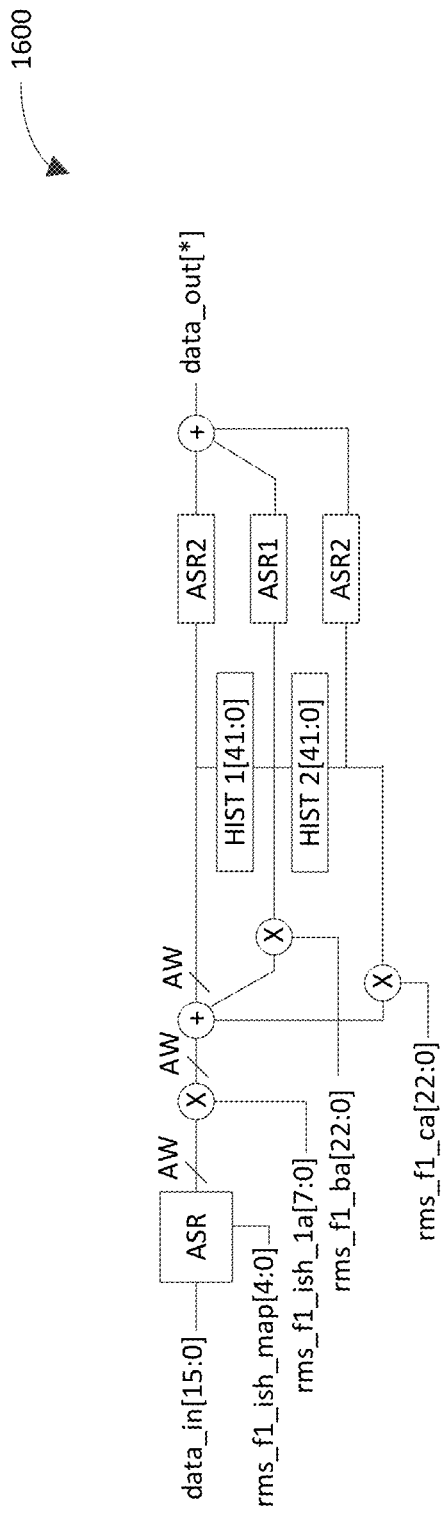
FIGS. 16 and 17 are block diagrams of respective filters shown in FIG. 14 in accordance with embodiments described herein.
Figure 17:
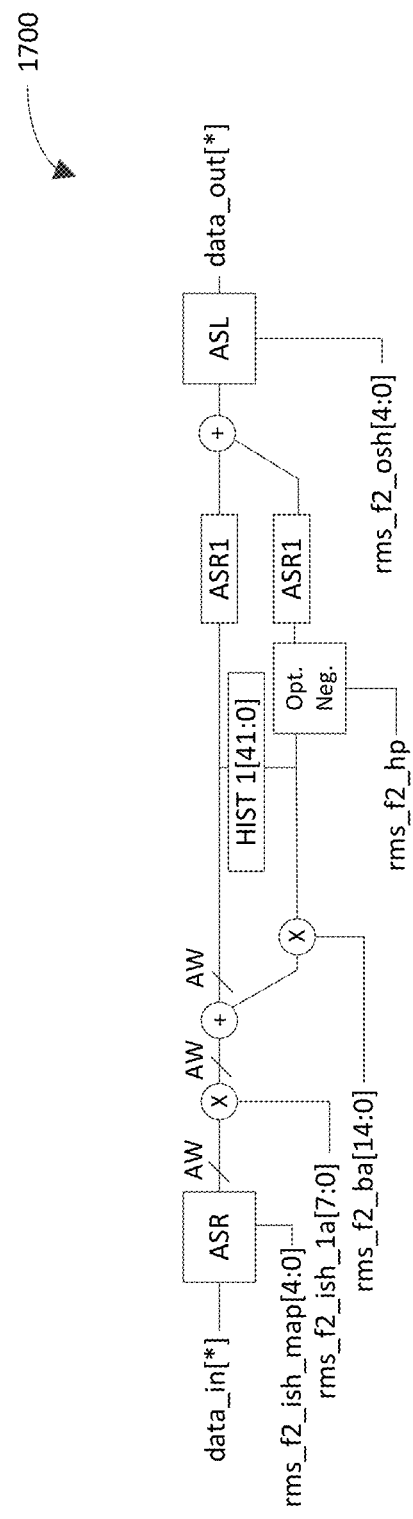

FIGS. 16 and 17 are block diagrams of respective filters 1600 and 1700 in accordance with embodiments described herein. Filters 1600 and 1700 are example implementations of respective filters 1528a and 1528b shown in FIG. 15. FIGS. 18 and 19 show tables 1800 and 1900 of example signal mappings in accordance with embodiments described herein. For instance, referring to FIGS. 16 and 17, the signals rms_f1_ish map and rms_f2_ish map are generated from rms_f1_ish and rms_f2_ish inputs as shown in FIG. 18. Mapping for the signal rms_f2_osh is shown in FIG. 19.

An example technique for determining coefficient settings for the filters 1600 and 1700 will now be described.

Filter 1600

The generic filter implementation has the following transfer function. For filter 1600, the desired transfer function may be created in the following form.

$$H_{LP}(z) = \frac{1 + 2z^{-1} + z^{-2}}{A - Bz^{-1} + Cz^{-2}} \quad \text{Equation 1}$$

A, B and C are positive values and may have further restrictions as noted below. An example procedure to determine filter coefficient settings from the above transfer function is as follows:

1. Calculate maximum (absolute value of) magnitude at any frequency of $$H_{S1} = \frac{1}{A - Bz^{-1} + Cz^{-2}}$$

and then choose integer value TMPORS to scale maximum such that $$H_{S1} = \frac{2^{-TMPORS}}{A - Bz^{-1} + Cz^{-2}}$$

(absolute value of) magnitude is less than 1.0 over a desired frequency range (e.g., all frequencies). (Saturation may occur in calculation at frequencies having a magnitude that is greater than 1.0, which may be acceptable if barely above 1.0.) In an example implementation, a valid range for TMPORS may be 0 to 1 for filter 1600 and 0 to 20 for filter 1700.

2. Choose TMPIRS and calculate TMP1A such that $$TMP1A = \text{round}\left(\frac{2^{TMPIRS} * 2^{-TMPORS}}{A}\right)$$

is greater or equal to 128 but less than 256. A valid range for TMPIRS may be 7 to 25.

3. Calculate $$TMPBA = \text{round}\left(2^{22} * \frac{B}{A}\right).$$

The result may be between 0 and 8388607.

4. Calculate $$TMPCA = \text{round}\left(2^{23} * \frac{C}{A}\right).$$

The result may be between 0 and 8388607.
Set rms_f1_1a to TMP1A dropping 1 in bit 7. Set rms_f1_ba to TMPBA. Set rms_f1_ca to TMPCA. Set rsm_f1_ish to (TMPIRS−7). Set rms_f1_osh to TEMPORS.

Filter 1700

The generic filter implementation has the following transfer function. For filter 1700, the desired transfer function may be created in one of these two forms. (Only filter 1700 is high-pass in this example for non-limiting, illustrative purposes.)

$$H_{LP}(z) = \frac{1 + 1z^{-1}}{A - Bz^{-1}} \text{ or } H_{HP}(z) = \frac{1 - z^{-1}}{A - Bz^{-1}} \quad \text{Equation 2}$$

A, B and C are positive values and may have further restrictions as noted below. An example procedure to determine filter coefficient settings from the above transfer functions is as follows:

5. Calculate maximum (absolute value of) magnitude at any frequency of $$H_{S1} = \frac{1}{A - Bz^{-1}}$$

and then choose integer value TMPORS to scale maximum such that $$H_{S1} = \frac{2^{-TMPORS}}{A - Bz^{-1}}$$

(absolute value of) magnitude is less than 1.0 over a desired frequency range (e.g., all frequencies). (Saturation may occur in calculation at frequencies having a magnitude that is greater than 1.0, which may be acceptable if barely above 1.0.) In an example implementation, a valid range for TMPORS may be 0 to 1 for filter 1600 and 0 to 20 for filter 1700.

6. Choose TMPIRS and calculate TMP1A such that $$TMP1A = \text{round}\left(\frac{2^{TMPIRS} * 2^{-TMPORS}}{A}\right)$$

is greater or equal to 128 but less than 256. A valid range for TMPIRS may be 7 to 25.

7. Calculate $$TMPBA = \text{round}\left(2^{14} * \frac{B}{A}\right).$$

The result may be between 0 and 8388607.
Set rms_f2_1a to TMP1A dropping 1 in bit 7. Set rms_f2_ba to TMPBA. Set rsm_f2_ish to (TMPIRS−7). Set rms_f2_osh to TEMPORS. Set rms_f2_hp to 1 for a high-pass or 0 for a low-pass.

Figure 20:
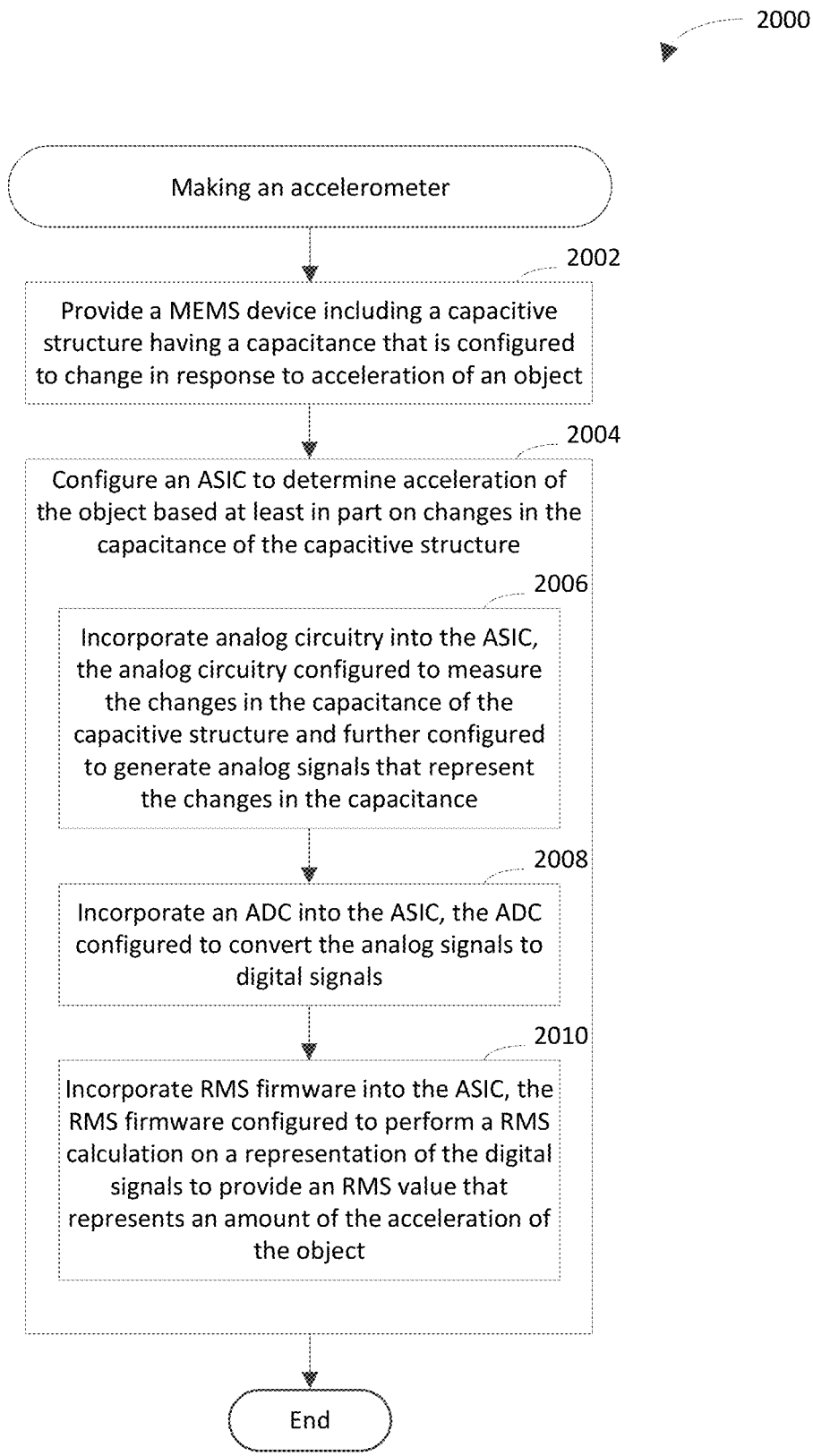
FIGS. 20-21 are flowcharts of methods for making an accelerometer in accordance with embodiments described herein.
Figure 21:
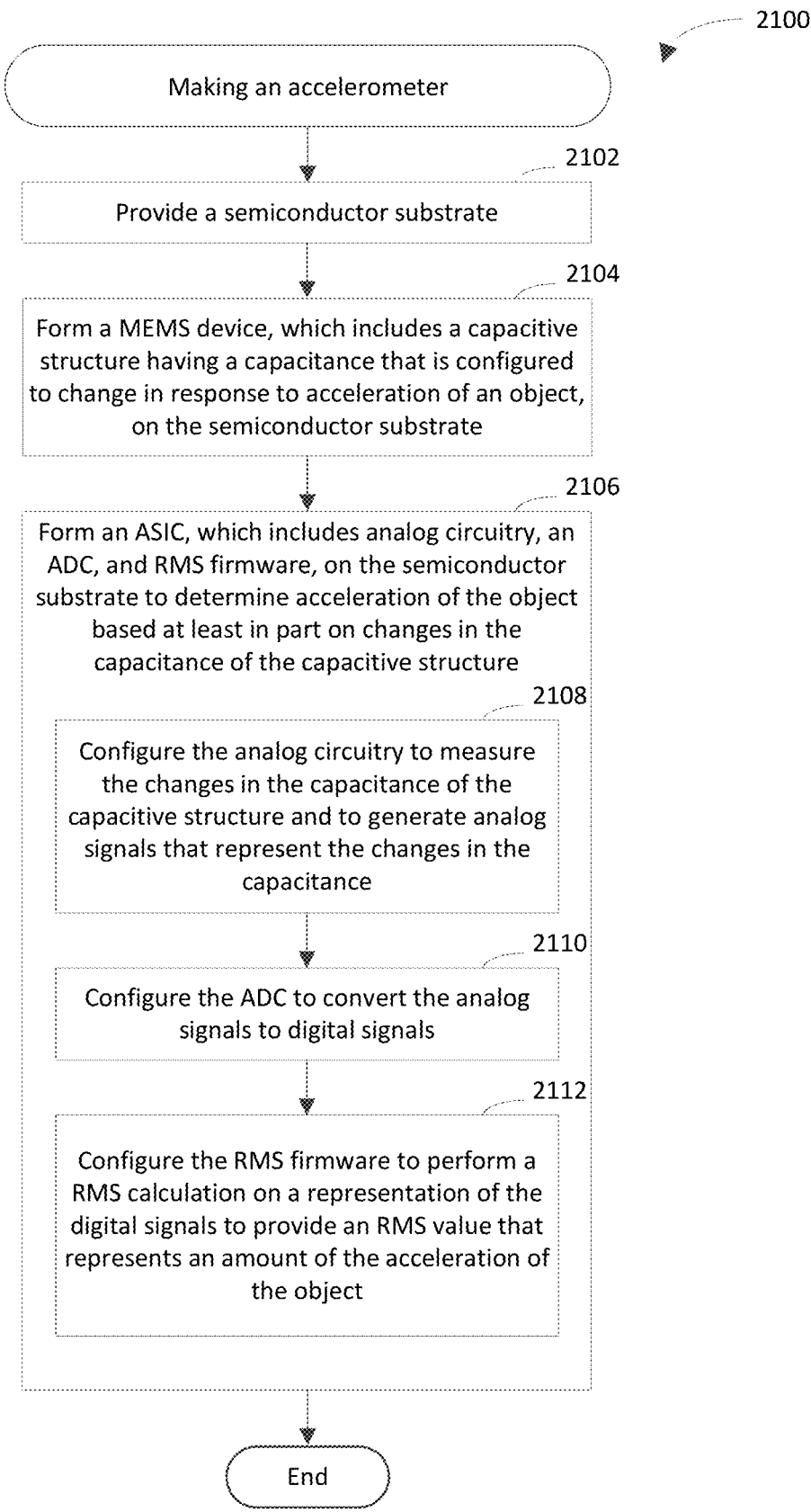
Figure 22:
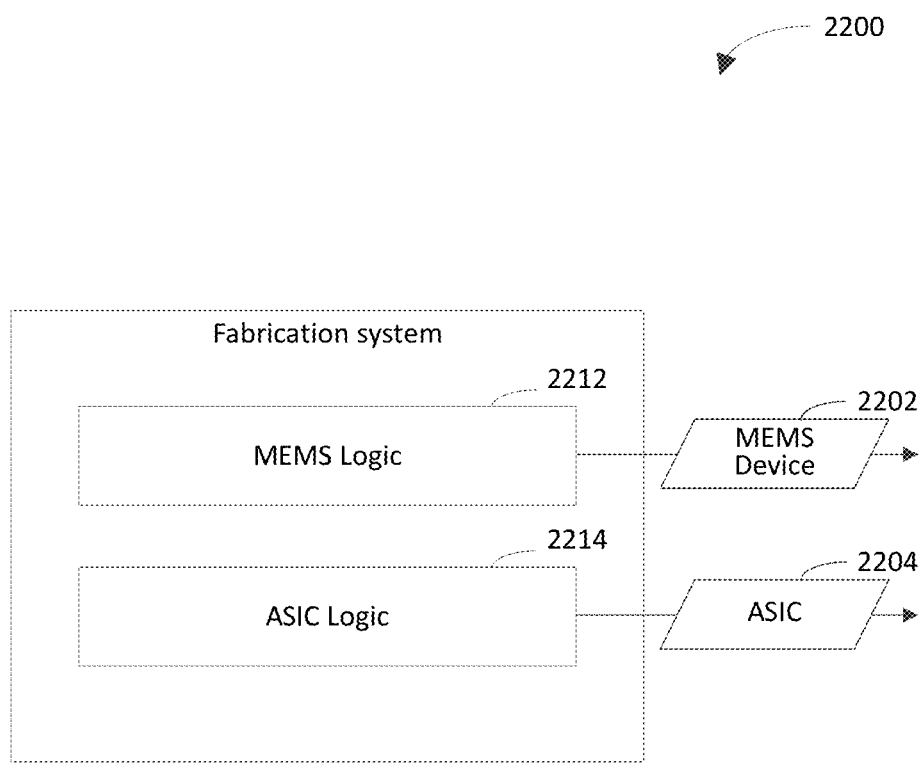
FIG. 22 is a block diagram of an example fabrication system in accordance with an embodiment described herein.

FIGS. 20-21 are flowcharts 2000 and 2100 of methods for making an accelerometer in accordance with embodiments described herein. For illustrative purposes, flowcharts 2000 and 2100 are described with respect fabrication system 2200 shown in FIG. 22. As shown in FIG. 22, fabrication system 2200 includes MEMS logic 2212 and ASIC logic 2214. Further structural and operational embodiments will be apparent to persons skilled in the relevant art(s) based on the discussion regarding flowcharts 2000 and 2100.

The method of flowchart 2000 relates to fabricating a semiconductor package to include a microelectromechanical systems (MEMS) device and an application-specific integrated circuit (ASIC). As shown in FIG. 20, the method of flowchart 2000 begins at step 2002. In step 2002, the MEMS device is fabricated to include a capacitive structure having a capacitance that is configured to change in response to acceleration of an object. In an example implementation, MEMS logic 2212 provides a MEMS device 2202.

At step 2004, the ASIC is configured to determine acceleration of the object based at least in part on changes in the capacitance of the capacitive structure. In an example implementation, ASIC logic 2214 configures an ASIC 2204.

Step 2004 includes steps 2006, 2008, and 2010. At step 2006, analog circuitry is incorporated into the ASIC. The analog circuitry is configured to measure the changes in the capacitance of the capacitive structure and further configured to generate analog signals that represent the changes in the capacitance.

At step 2008, an analog-to-digital converter (ADC) is incorporated into the ASIC. The ADC is configured to convert the analog signals to digital signals.

At step 2010, RMS firmware is incorporated into the ASIC. The RMS firmware is configured to perform a root-mean-square (RMS) calculation on a representation of the digital signals to provide an RMS value that represents an amount of the acceleration of the object.

In an example embodiment, providing the MEMS device at step 2002 includes fabricating the MEMS device to include the capacitive structure. In accordance with this embodiment, configuring the ASIC at step 2004 includes fabricating the ASIC. In an aspect of this embodiment, fabricating the ASIC includes fabricating the analog circuitry, the ADC, and the RMS firmware on a common substrate (e.g., a common semiconductor substrate). In an implementation of this aspect, fabricating the MEMS device includes fabricating the MEMS device on the common substrate. In another aspect of this embodiment, fabricating the ASIC includes fabricating a digital filter that includes a bandpass filter configured to block frequencies that are not included in a designated frequency band such that the digital filter is coupled between the ADC and the RMS firmware.

In another example embodiment, incorporating the analog circuitry into the ASIC at step 2006 includes fabricating the analog circuitry (e.g., to form the ASIC); incorporating the ADC into the ASIC at step 2008 includes fabricating the ADC; and/or incorporating the RMS firmware into the ASIC at step 2010 includes fabricating the RMS firmware.

In yet another example embodiment, configuring the ASIC at step 2004 includes configuring (e.g., fabricating) a digital filter to down-sample a rolling average of the digital signals to provide a down-sampled rolling average signal. In accordance with this embodiment, incorporating the RMS firmware into the ASIC at step 2010 includes configuring (e.g., fabricating) the RMS firmware to perform the RMS calculation on the down-sampled rolling average signal to provide the RMS value that represents the amount of the acceleration of the object.

In still another example embodiment, incorporating the RMS firmware into the ASIC at step 2010 includes configuring the RMS firmware to perform multiple RMS calculations on the representation of the digital signals to provide respective RMS values that represent respective amounts of the acceleration of the object with respect to respective frequencies.

In yet another example embodiment, incorporating the RMS firmware into the ASIC at step 2010 includes configuring the RMS firmware to be capable of generating an interrupt signal based at least in part on the RMS value reaching a threshold (e.g., based at least in part on the RMS value being greater than or equal to an upper threshold or less than or equal to a lower threshold). For instance, the RMS firmware may be configured to generate the interrupt signal.

In some example embodiments, one or more steps 2002, 2004, 2006, 2008, and/or 2010 of flowchart 2000 may not be performed. Moreover, steps in addition to or in lieu of steps 2002, 2004, 2006, 2008, and/or 2010 may be performed.

As shown in FIG. 21, the method of flowchart 2100 begins at step 2102. In step 2102, a semiconductor substrate is provided. In an example implementation, the MEMS logic 2212 and/or the ASIC logic 2214 provides the semiconductor substrate.

At step 2104, a MEMS device is formed on the semiconductor substrate. The MEMS device includes a capacitive structure having a capacitance that is configured to change in response to acceleration of an object. In an example implementation, the MEMS logic 2212 forms a MEMS device 2202 on the semiconductor substrate.

At step 2106, an ASIC is formed on the semiconductor substrate to determine acceleration of the object based at least in part on changes in the capacitance of the capacitive structure. The ASIC includes analog circuitry, an ADC, and RMS firmware. In an example implementation, the ASIC logic 2214 forms an ASIC 2204 on the semiconductor substrate.

Step 2106 includes steps 2108, 2110, and 2112. At step 2108, the analog circuitry is configured to measure the changes in the capacitance of the capacitive structure and to generate analog signals that represent the changes in the capacitance.

At step 2110, the ADC is configured to convert the analog signals to digital signals.

At step 2112, the RMS firmware is configured to perform a RMS calculation on a representation of the digital signals to provide an RMS value that represents an amount of the acceleration of the object.

In some example embodiments, one or more steps 2102, 2104, 2106, 2108, 2110, and/or 2112 of flowchart 2100 may not be performed. Moreover, steps in addition to or in lieu of steps 2102, 2104, 2106, 2108, 2110, and/or 2112 may be performed.

Figure 24:
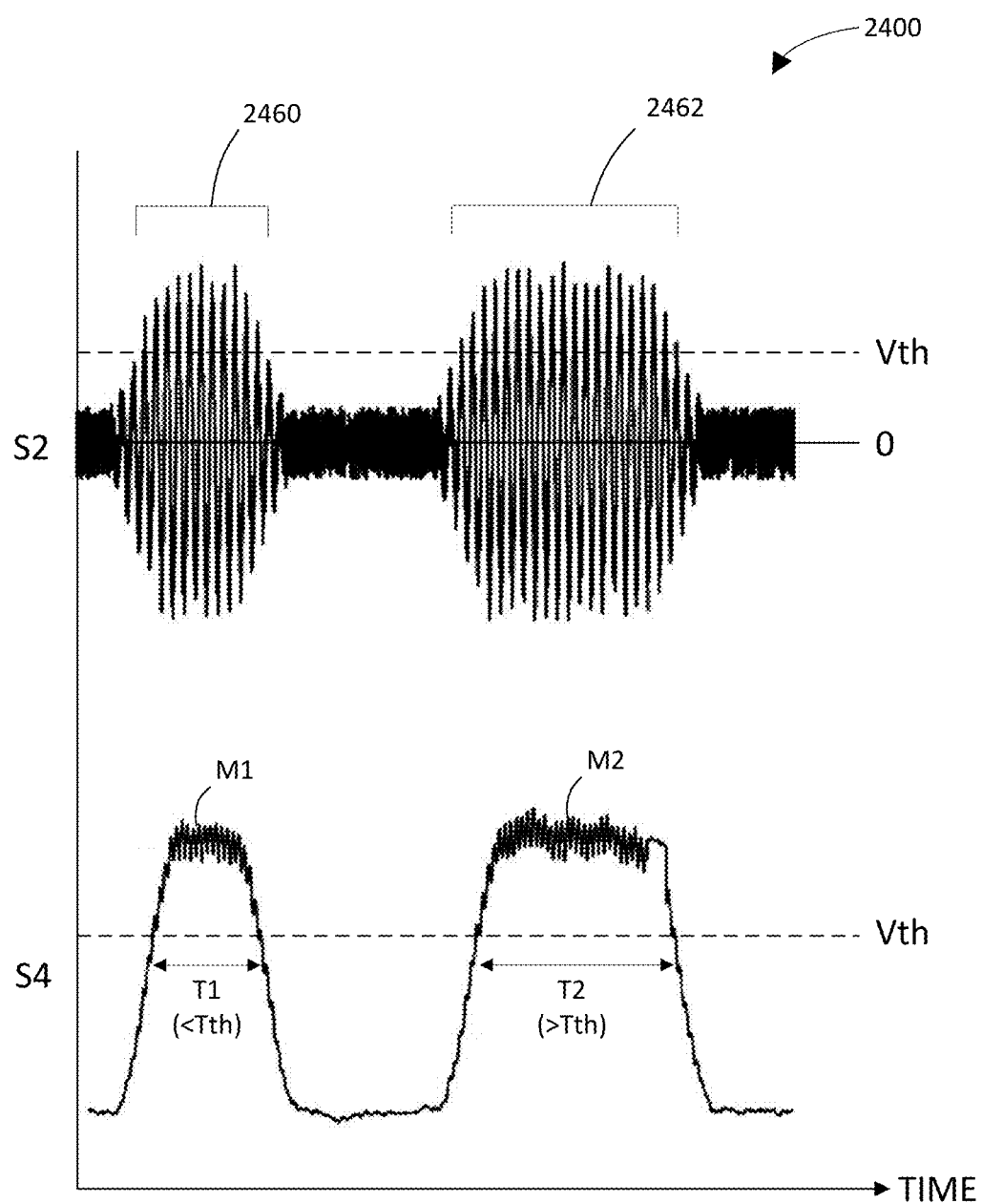
FIG. 24 shows an example plot of digital output versus RMS output in accordance with an embodiment described herein.

FIG. 24 shows an example plot 2400 of digital output versus RMS output in accordance with at least one embodiment described herein. The plot 2400 shows a digital output signal S2 that can be created before an RMS calculation, and an RMS output signal S4 that can be created after the RMS calculation. In at least one embodiment, the RMS calculation result (i.e., the RMS output signal S4) is fed to an interrupt controller. The interrupt controller outputs an interrupt signal to a microcomputer. When an acceleration sensor is used as a motion sensor to measure motion of a measurement object, the digital output signal S2 contains an oscillating component (i.e., alternating-current component) that reflects the motion of the measurement object (i.e., the acceleration that acts on the motion sensor). As shown in FIG. 24, when the measurement object is in motion, as shown by time periods 2460 and 2462, the digital output signal S2 contains an oscillating component with a signal value having an amplitude that is greater than a predetermined threshold level Vth.

The signal before the RMS calculation can be an output signal after variable filtering is applied. Variable filtering includes filtering that has a variable arrangement. For example, variable filtering can be implemented by serial arrangement of two variable filtering portions. In at least one embodiment, each variable filtering portion can be a LPF or a HPF. A cut-off frequency of each variable filtering portion can be a variable, or the variable filtering portion can be changed from LPF to HPF, or HPF to LPF. For example, a serial arrangement of HPF (cut-off frequency fH) and LPF (cut-off frequency fL) with fH<fL for variable filtering can create a signal after the variable filtering that is in a particular frequency range between fH and fL. As a result, the digital output signal S2 can indicate motion or oscillation in a particular frequency range after applying variable filtering.

In the illustrated embodiment, the amplitude of the digital output signal S2 does not remain greater than the threshold level Vth at all instances of time while the measurement object is in motion. Instead, the amplitude of the digital output signal S2 oscillates so that it rises above, and falls below, the threshold level Vth. Because of that oscillation in amplitude, feeding the digital output signal S2 directly to the interrupt controller and comparing it with the threshold level Vth can create error in detection of a motion or oscillation within a particular frequency range. Additionally, the oscillation of the digital output signal S2 can be asynchronous with the operation timing of the interrupt controller (i.e., the timing with which the interrupt controller samples the signal fed to it). A sufficiently high operating speed (i.e., clock frequency) in the interrupt controller would be required if the digital output signal S2 were fed directly to the interrupt controller to avoid the error.

However, the RMS output signal S4 can be fed to the interrupt controller to reduce error. The RMS output signal S4, which can be generated by subjecting the digital output signal S2 to variable filtering and then to RMS calculation, has an amplitude that is maintained greater than the threshold level Vth for the entire duration that a motion or oscillation is in a particular frequency range, which can be defined by the pass band of a variable filter. The RMS calculation is performed, for example, by calculating the RMS signal as $\sqrt{(S13(1)2+S13(2)2 \ldots +S13(N)2)}$ using N digital signals S13(1)-S13(N). For example, N digital signals can be 3 digit signals S13(1)-S13(3) for x, y, z-axis signals. Other arrangements are possible for the N digital signals S13(1)-S13(N).

In at least one embodiment, the interrupt controller can detect a motion or oscillation in the particular frequency range by checking whether the amplitude of the RMS output signal S4 has remained greater than the predetermined threshold level Vth (e.g., Vth=0.5 V) for a predetermined threshold time period Tth. In an example embodiment, the threshold time period Tth is 10 ms. In another example embodiment, the threshold time period Tth is in a range between about 5 ms and about 15 ms. In the illustrated example, the RMS output signal S4 rises above the predetermined threshold level Vth twice over the plotted duration. In an example, the first motion M1 of time period 2460 can be ignored by the interrupt controller because the time period T1 for which S4>Vth is shorter than the threshold time period Tth. In contrast, the second motion M2 can be detected by the interrupt controller because the time period for which S4>Vth is longer than the threshold time period Tth.

Figure 25:
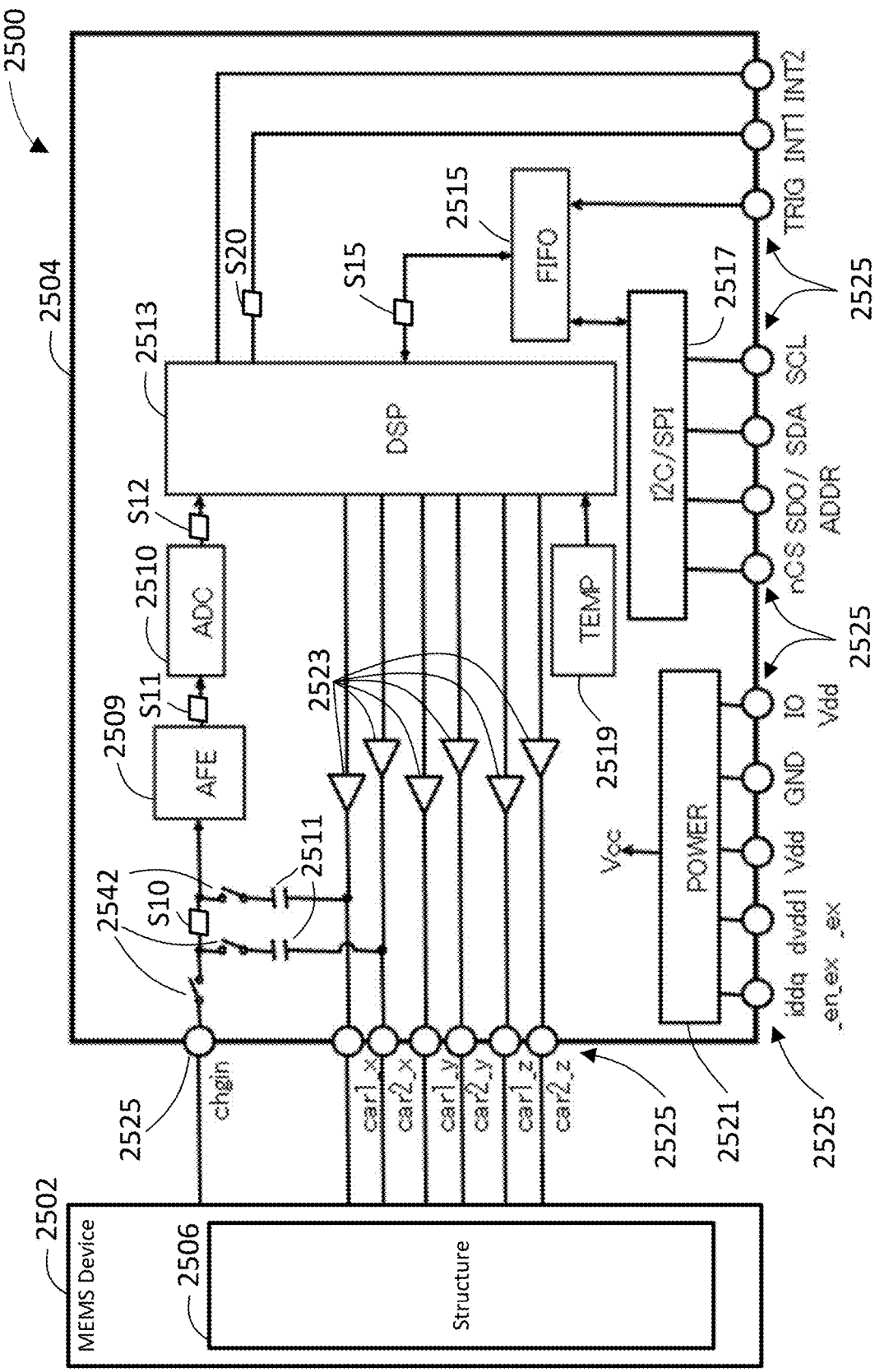
FIG. 25 is a block diagram of an example accelerometer in accordance with an embodiment described herein.

FIG. 25 is a block diagram showing an example accelerometer 2500. Accelerometer 2500 includes a MEMS device 2502 and an ASIC 2504. The MEMS device 2502 includes a structure 2506 that can be a capacitive structure. The ASIC 2504 includes switches 2542, an analog front end (AFE) 2509, capacitors 2511, an ADC 2510, a digital signal processor (DSP) 2513, a first-in-first-out (FIFO) buffer 2515, a communication interface 2517, a temperature sensor 2519, an internal power source 2521, and buffers 2523. The ASIC 2504 can be connected to a host microcomputer (not shown).

The switches 2542 and the capacitors 2511 can be used to eliminate the noise that occurs in the ASIC 2504 when it detects acceleration along an axis, such as an X-axis as will be described below. A similar construction can be adopted for constructions that are configured to detect acceleration along each of a Y-axis and a Z-axis. The capacitors 2511 can be selected to have any capacitance value. In at least one embodiment, the capacitors 2511 have the same capacitance value.

The AFE 2509 performs predetermined analog adjustment processing on a sensor output signal S10 to generate an analog signal S11. In an example embodiment, the AFE 2509 is configured to provide amplification of the sensor output signal S10. In an example embodiment, the AFE 2509 is configured to provide noise elimination on the sensor output signal S10. The analog signal S11 is fed into the ADC 2510, which converts the analog signal S11 to a digital signal S12.

In some example embodiments, the DSP 2513 is configured to receive the digital signal S12 and to generate an interrupt signal S20. The ASIC 2504 can output the interrupt signal S20 to a host microcomputer. The DSP 2513 can also generate an output selection signal S15 to send to the FIFO buffer 2515. The DSP 2513 can also be configured to access the FIFO buffer 2515, conduct serial communication via the communication interface 2517, monitor the temperature sensor 2519, and perform 3-axis (e.g., X-axis, Y-axis, and Z-axis) calibration on the MEMS device 2502 via the buffers 2523.

In some example embodiments, the FIFO buffer 2515 holds, on a first-in-first-out basis, various kinds of data that are processed by the DSP 2513. The kinds of data can include raw acceleration data and/or RMS calculation data. A host can access the FIFO buffer 2515 via the communication interface 2517 to read the various kinds of data stored in the FIFO buffer 2515. In at least one embodiment, the data is read serially.

In some example embodiments, the communication interface 2517 is an interface for bidirectional serial communication with a host via an I2C/SPI bus 4. In at least one embodiment, the communication interface 2517 includes control registers.

In some example embodiments, the temperature sensor 2519 is an incorporated sensor that senses the temperature of the ASIC 2504. In at least one example embodiment, the temperature sensor 2519 senses the temperature of the ASIC 2504 at a junction between a semiconductor substrate and the MEMS device 2502 and/or the ASIC 2504.

In some example embodiments, the internal power source 2521 generates an internal supply voltage Vcc from an external supply voltage Vdd to supply it to the different blocks in the ASIC 2504.

The buffers 2523 respectively shape the waveforms of calibration signals fed from the DSP 2513 and feed the calibration signals to the MEMS device 2502. The calibration signals can be used to drive the MEMS device 2502.

In some example embodiments, the ASIC 2504 is provided with a plurality of terminals, or pads 2525, for electrical connection with devices outside of the ASIC 2504. In the illustrated embodiment, a plurality of pads 2525 are provided for electrical connection with devices outside of the ASIC 2504 (e.g., chgin (corresponding to an input element), car1_x, car2_x, car1_y, car2_y, car1_z, car2_z, iddg_en_ex, dvdd1_ex, Vdd, GND, IOVdd, nCS, SDO/ADDR, SDA, SCL, TRIG, INT1, and INT2).

In at least one example embodiment, X-axis differential drive signals are fed from the DSP 2513 to the MEMS device 2502 via the buffers 2523 (e.g., through pads car1_x and car2_x). Similarly, Y-axis differential drive signals can be fed via the buffers 2523 to the MEMS device 2502 (e.g., through pads car1_y and car2_y). Similarly, Z-axis differential drive signals can be fed via the buffers 2523 to the MEMS device 2502 (e.g., through pads car1_z and car2_z).

In example embodiments, the drive signals are fed to MEMS capacitors (not shown) of the MEMS structure 2506 provided in the MEMS device 2502, where two MEMS capacitors are provided equivalently for each of X, Y, and Z axes. The MEMS structure 2506 is configured so that capacitance values of the two MEMS capacitors for each axis vary such that, according to acceleration, one increases and the other decreases. In at least one embodiment, adding the capacitance values of the two MEMS capacitors cancels an offset that can arise within the MEMS device 2502 due to temperature characteristics etc. and noise applied to the MEMS device 2502.

Figure 26:
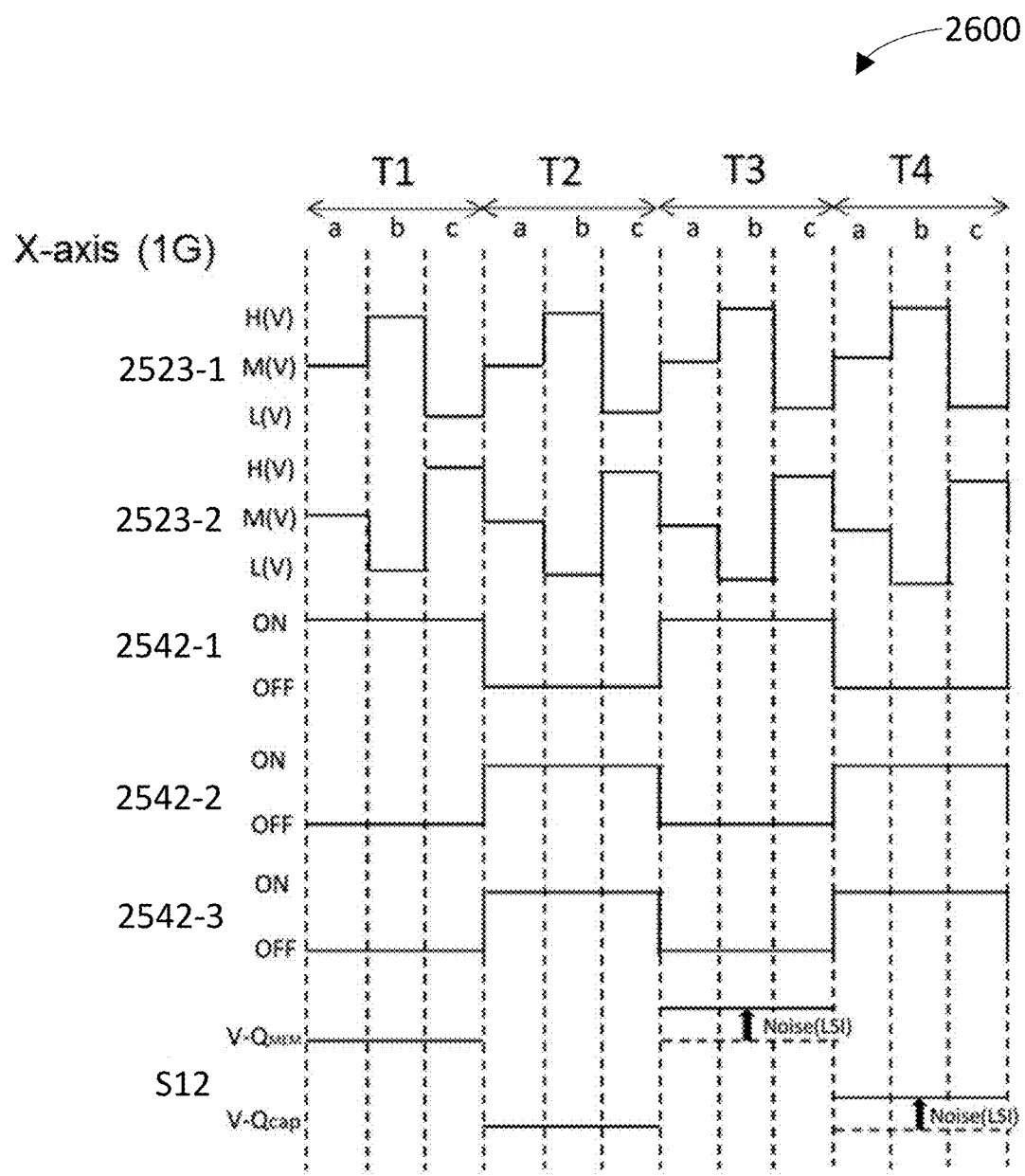
FIG. 26 shows an example timing diagram of an accelerometer in accordance with an embodiment.

FIG. 26 shows an example timing diagram 2600 of an accelerometer, such as accelerometer 2500 of FIG. 25. The timing diagram 2600 illustrates elimination of noise from an ASIC, such as ASIC 2504 of FIG. 25. The timing diagram 2600 illustrates an example operational mode of the accelerometer where an acceleration of 1G is detected along an X-axis.

In an example embodiment, drive signals for differential control are fed via buffers 2523 to the two MEMS capacitors (not shown) included in the MEMS structure 2506 of the MEMS device 2502. A value V-QMEM resulting from adding up capacitance values of the MEMS capacitors is fed into the ASIC 2504, such as via the pad 2525 chgin.

In example embodiments, the outputs of the buffers 2523 (e.g., 2523-1 and 2523-2) are controlled so that their sum equals the difference between H (V) relative to M (V). During time period T1, the switch 2542-1 is on and the switches 2542-2 and 2542-3 are off; thus, the value fed in via the terminal chgin is the capacitance value V-$Q_{MEM}$ from the MEMS device 2502.

During time period T2, the switch 2542-1 is off and the switches 2542-2 and 2542-3 are on; thus, the value fed in via the terminal chgin is the capacitance value V-$Q_{cap}$ from the noise elimination capacitors 2511. Then a calculator, that can be included in the DSP 2513, can calculate the difference between V-$Q_{MEM}$ and V-$Q_{cap}$ as converted into digital values. As a result, even in the presence of noise from the ASIC 2504, as in time periods T3 and T4, the noise can be cancelled with the calculated difference. In at least one embodiment, if the switch 2542-1 is on and the switches 2542-2 and 2542-3 are off for all of the time periods, the digital signal S12 is outputted (i.e., the calculator outputs the digital signal S12).

Figure 27:
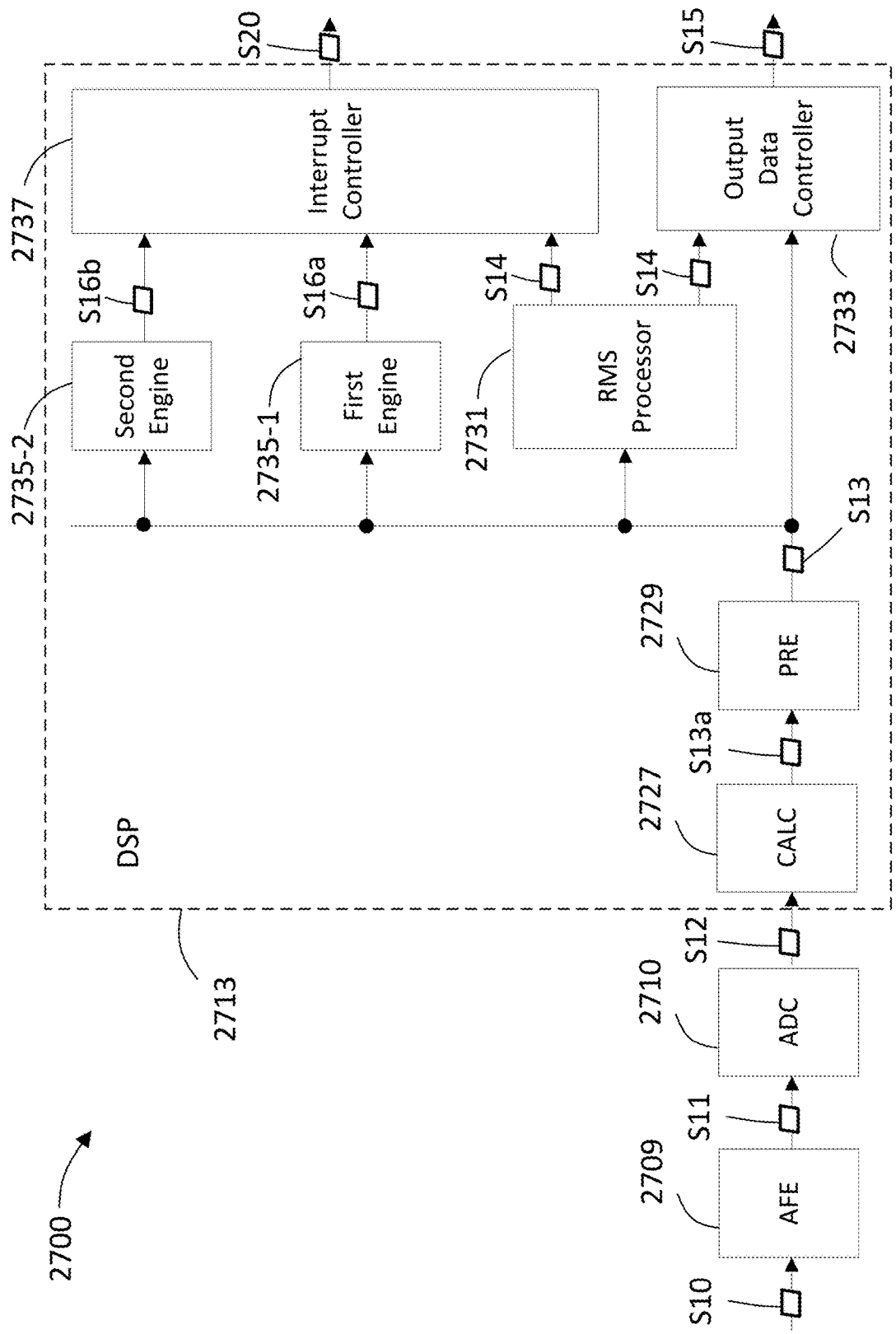
FIG. 27 is a block diagram of an example digital signal processor (DSP) that can be included an accelerometer in accordance with an embodiment.

FIG. 27 is a block diagram 2700 showing an example of a DSP 2713, such as the DSP 2513 that is included in the accelerometer 2500 of FIG. 25. The DSP 2713 includes a calculator 2727 ("CALC"), a preprocessor 2729, an RMS processor 2731, an output data controller 2733, various engines 2735, and an interrupt controller 2737.

In an example, the calculator 2727 performs predetermined calculation processing to the digital signal S12 fed to it from the terminal chgin via the AFE 2709 and the ADC 2710, to output a digital signal S13a. For example, the predetermined calculation processing can include a calculation of the difference between H (V) relative to M (V) mentioned above. Also as described above, if the switch 2542-1 is on and the switches 2542-2 and 2542-3 are off for all of the time periods, the calculator 2727 can be configured to output the digital signal S12.

In some embodiments preprocessor 2729 subjects the digital signal S13a to various kinds of preprocessing to output a digital signal S13. For example, the preprocessing can include noise elimination, offset adjustment, gain adjustment, variable filtering, and band-width restriction.

In some embodiments, the RMS processor 2731 calculates the root-mean-square of the digital signal S13 to output an RMS signal S14. For example, when calculating the root-mean-square of N digital signals S13(1)-S13(N), the RMS signal S14 is defined as S14=$\sqrt{(S13_{(1)}^2+S13_{(2)}^2 \ldots +S13_{(N)}^2)}$, as a RMS calculation result.

As illustrated, the RMS signal S14 is outputted to the interrupt controller 2737. In an example embodiment, the digital signal S12 corresponds to the signal S2 in FIG. 24, and the RMS signal S14 corresponds to the signal S4 in FIG. 24.

In some embodiments, the output data controller 2733 feeds either the digital signal S13 or the RMS signal S14 out of the DSP 2713 (to the FIFO buffer) as a selection signal S15. In at least one example embodiment, the output data controller 2733 feeds the selection signal S15 to the FIFO buffer, such as FIFO buffer 2515 of FIG. 25.

In at least one example embodiment, an information acquisition engine 2735 is a functional block that acquires various kinds of information (e.g., the status of an electronic device) from the digital signal S13 (i.e., raw acceleration data that has not been subjected to RMS calculation). The engine 2735 can include a plurality of engines. In the illustrated embodiment, the information acquisition engine 2735 includes a first engine 2735-1 and a second engine 2735-2.

In some embodiments, the interrupt controller 2737 generates an interrupt signal S20 that is output to the host microcomputer. In at least one embodiment, the interrupt controller 2737 generates the interrupt signal S20 according to the RMS signal S14 fed from the RMS processor 2731. The interrupt controller 2737 can also reference various detection signals S16a and S16b fed from the information acquisition engine 2735, to output an interrupt signal S20 to the host microcomputer.

Figure 28:
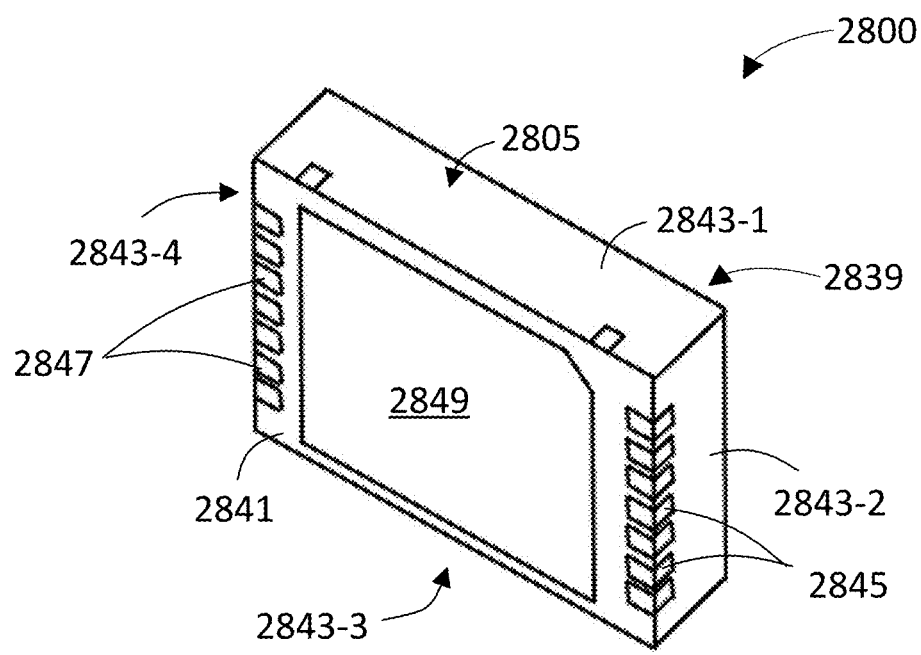
FIG. 28 is a bottom perspective view of an accelerometer in accordance with an embodiment.
Figure 29:
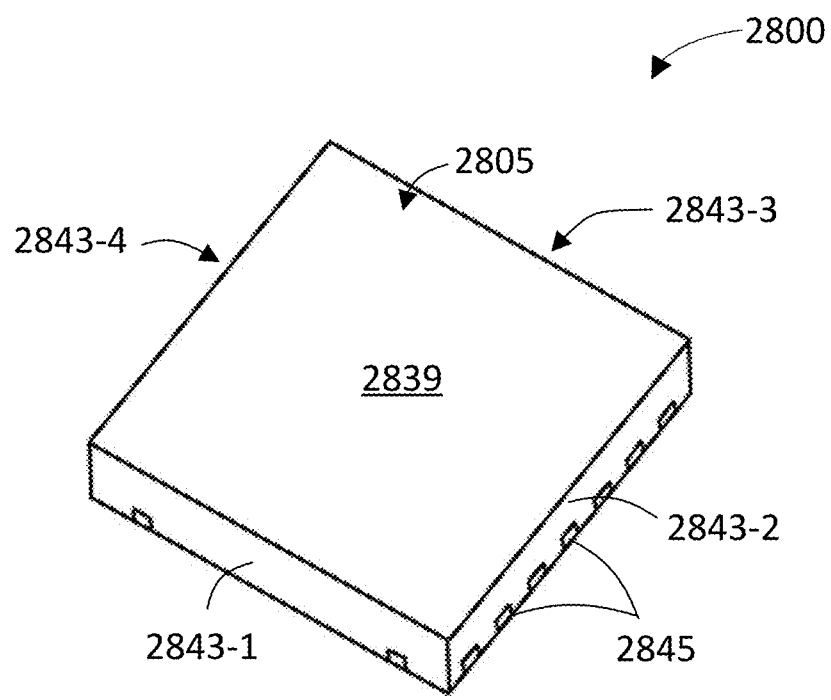
FIG. 29 is a top perspective view of an accelerometer in accordance with an embodiment.

FIGS. 28 and 29 illustrate an accelerometer 2800 in accordance with an embodiment. The accelerometer 2800 includes a MEMS device and an ASIC that are housed inside of a package 2805. In the illustrated embodiment, the package 2805 is shaped as a thin parallelepiped having a top surface 2839, a bottom surface 2841 opposite from the top surface 2839, and four side surfaces 2843-1 to 2843-4 extending between the top surface 2839 and the bottom surface 2841.

In at least one embodiment, the side surfaces 2843-2 and 2843-4, which are disposed opposite from each other, each include a plurality of external terminals 2845 and 2847, respectively. The plurality of external terminals 2845 and 2847 are exposed from the side surfaces 2843-2 and 2843-4, and also exposed from the bottom surface 2841. In at least one embodiment, a bottom terminal 2849 is provided on the bottom surface 2841. The bottom terminal 2849 can be configured to cover a large portion of the bottom surface 2841. In at least one embodiment, the bottom terminal 2849 is a heat-sink pad that is configured to provide heat dissipation from the components in the package 2805. In the illustrated embodiment, accelerometer 2800 employs a dual flatpack no-leaded (DFN) package.

Figure 30:
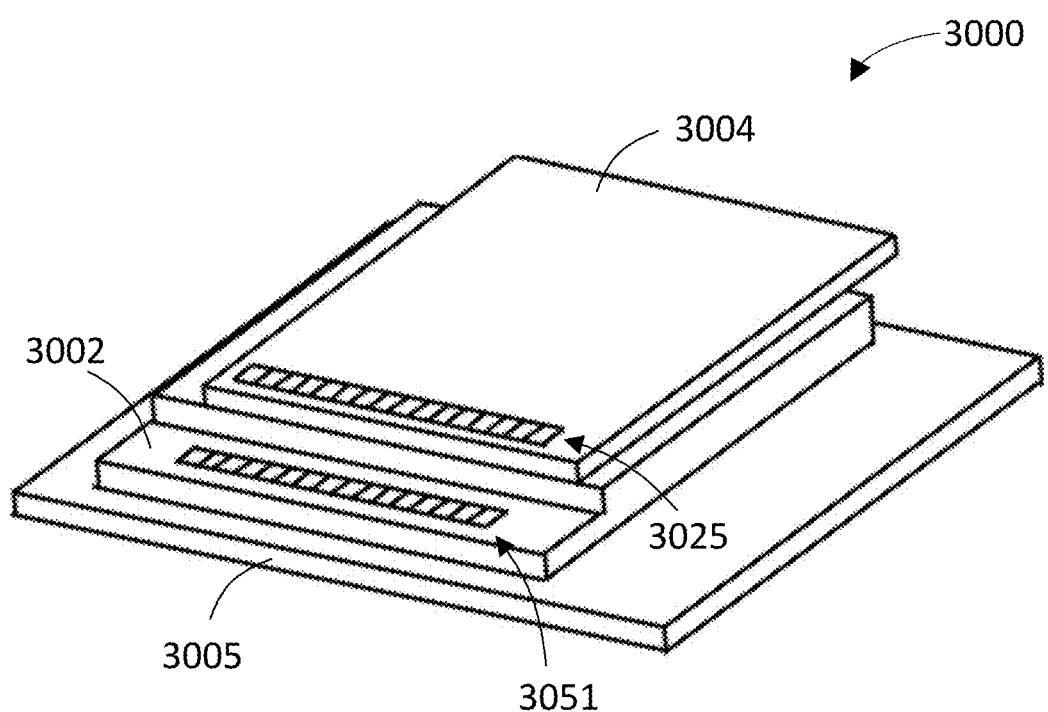
FIG. 30 is a top perspective view of a portion of an accelerometer in accordance with an embodiment.

FIG. 30 shows an example of an internal structure of an accelerometer 3000 in accordance with an embodiment. For example, the structure shown in FIG. 30 can be included in accelerometer 2800 of FIGS. 28 and 29. In the illustrated embodiment, the accelerometer 3000 is configured as a stacked assembly of a MEMS device 3002, an ASIC 3004, and a substrate 3005. In the illustrated embodiment, the MEMS device 3002 and the ASIC 3004 are stacked on the substrate 3005. The substrate 3005 can be a laminate substrate. In at least one non-limiting embodiment, the MEMS device 3002 is mounted on a top surface of the substrate 3005, and the ASIC 3004 is mounted on a top surface of the MEMS device 3002 so that the components form a stack on a common substrate. In other example embodiments, the MEMS device and the ASIC are mounted side by side on the common substrate. In other example embodiments, the MEMS device and the ASIC can be formed by fabricating the components in a common substrate.

In some embodiments, the ASIC 3004 is provided with terminals, or pads 3025. The pads 3025 can be arranged in any way on the ASIC 3004. In at least one example, the pads 3025 are arranged in an array disposed along one side of the ASIC 3004. The ASIC 3004 can be a chip that is cut out in the shape of a thin rectangular sheet.

In some embodiments, the MEMS device 3002 is formed in the shape of a thin rectangular sheet. In at least one embodiment, the MEMS device 3002 includes a lowered step that extends along one side of the MEMS device 3002. The MEMS device 3002 can also include terminals, or pads 3051. The pads 3051 can be arranged in an array.

In some embodiments, the pads 3025 on the ASIC 3004 and the pads 3051 on the MEMS device 3002 are arranged in two rows extending beside each other. The ASIC 3004 can be arranged so that one side of the ASIC 3004 is flush with a side of the step on the MEMS device 3002, as shown, so that the pads 3025 of the ASIC 3004 are disposed adjacent the pads 3051 of the MEMS device 3002. The proximity of the pads 3025 of the ASIC 3004 and the pads 3051 of the MEMS device 3002 can be utilized to reduce the length of wires (not shown) used to form electrical connections between the MEMS device 3002 and the ASIC 3004.

In some embodiments, an integrated circuit (AFE) can include a driver configured to feed a MEMS device with a drive signal for noise elimination, an input element configured to be fed with an output from the MEMS device resulting from the driving signal being output via the MEMS device, a calculator configured to process a signal from the input element, and a capacitor provided between the driver and the input element and configured to turn on and off electrical connection therebetween. In at least one embodiment, the calculator can be configured to calculate the difference between the signal output via the MEMS device and the signal output via the capacitor without passing through the MEMS device. In at least one embodiment, the integrated circuit can further include a first switch provided between the input element and the calculator. In a further aspect, the integrated circuit can include a second switch configured to turn on and off electrical connection of the capacitor. In a further aspect, the first and second switches can be configured to be turned on and off in a mutually exclusive relationship. In a further aspect, the first and second switches can be configured to be turned on and off at equal time intervals. In at least one embodiment, the drive signal can be configured to be a differential signal between two paths. In a further aspect, the integrated circuit can include, as the capacitor, two capacitors and further include, in addition to the second switch, a third switch, with the second and third switches being configured to be turned on and off to be in the same state.

III. Further Discussion of Some Example Embodiments

A first example accelerator comprises a microelectromechanical systems (MEMS) device, an application-specific integrated circuit (ASIC), and RMS firmware. The MEMS device includes a capacitive structure having a capacitance that is configured to change in response to acceleration of an object. The ASIC is configured to determine acceleration of the object based at least in part on changes in the capacitance of the capacitive structure. The ASIC comprises analog circuitry and an analog-to-digital converter (ADC). The analog circuitry is configured to measure the changes in the capacitance of the capacitive structure. The analog circuitry is further configured to generate analog signals that represent the changes in the capacitance. The ADC is configured to convert the analog signals to digital signals. The RMS firmware is configured to perform a root-mean-square (RMS) calculation on a representation of the digital signals to provide an RMS value that represents an amount of the acceleration of the object.

In a first aspect of the first example accelerator, the MEMS device and the ASIC are implemented on a common semiconductor chip.

In a second aspect of the first example accelerator, the ASIC further comprises a digital filter configured to filter the digital signals to provide filtered digital signals. In accordance with the second aspect, the RMS firmware is configured to perform the RMS calculation on the filtered digital signals to provide the RMS value that represents the amount of the acceleration of the object. In further accordance with the second aspect, the digital filter includes at least one Butterworth filter. The second aspect of the first example accelerometer may be implemented in combination with the first aspect of the first example accelerometer, though the example embodiments are not limited in this respect.

In a third aspect of the first example accelerometer, the ASIC further comprises a digital filter configured to filter the digital signals to provide filtered digital signals. In accordance with the third aspect, the RMS firmware is configured to perform the RMS calculation on the filtered digital signals to provide the RMS value that represents the amount of the acceleration of the object. In further accordance with the third aspect, the digital filter includes at least one Bessel filter. The third aspect of the first example accelerometer may be implemented in combination with the first and/or second aspect of the first example accelerometer, though the example embodiments are not limited in this respect.

In a fourth aspect of the first example accelerometer, the ASIC further comprises a digital filter configured to filter the digital signals to provide filtered digital signals. In accordance with the fourth aspect, the RMS firmware is configured to perform the RMS calculation on the filtered digital signals to provide the RMS value that represents the amount of the acceleration of the object. In further accordance with the fourth aspect, the digital filter includes at least one Chebyshev filter. The fourth aspect of the first example accelerometer may be implemented in combination with the first, second, and/or third aspect of the first example accelerometer, though the example embodiments are not limited in this respect.

In a fifth aspect of the first example accelerometer, the ASIC further comprises a digital filter configured to filter the digital signals to provide filtered digital signals. In accordance with the fifth aspect, the RMS firmware is configured to perform the RMS calculation on the filtered digital signals to provide the RMS value that represents the amount of the acceleration of the object. In further accordance with the fifth aspect, the digital filter includes a bandpass filter configured to block frequencies that are not included in a designated frequency band. The fifth aspect of the first example accelerometer may be implemented in combination with the first, second, third, and/or fourth aspect of the first example accelerometer, though the example embodiments are not limited in this respect.

In a sixth aspect of the first example accelerometer, the ASIC further comprises a digital filter configured to filter the digital signals to provide filtered digital signals. In accordance with the sixth aspect, the RMS firmware is configured to perform the RMS calculation on the filtered digital signals to provide the RMS value that represents the amount of the acceleration of the object. In further accordance with the sixth aspect, the digital filter includes a plurality of signal processing filters. In further accordance with the sixth aspect, each of the plurality of signal processing filters has a set of user-programmable coefficients that are capable of having a plurality of sets of values. In further accordance with the sixth aspect, at least a first set of values causes the respective signal processing filter to be configured as a Butterworth filter, and at least a second set of values causes the respective signal processing filter to be configured as a Bessel filter. The sixth aspect of the first example accelerometer may be implemented in combination with the first, second, third, fourth, and/or fifth aspect of the first example accelerometer, though the example embodiments are not limited in this respect.

In a seventh aspect of the first example accelerometer, the ASIC further comprises a digital filter configured to filter the digital signals to provide filtered digital signals. In accordance with the seventh aspect, the RMS firmware is configured to perform the RMS calculation on the filtered digital signals to provide the RMS value that represents the amount of the acceleration of the object. In further accordance with the seventh aspect, the digital filter is configured to sample the representation of the digital signals at a sampling frequency that is greater than or equal to an output data rate of the RMS firmware. The seventh aspect of the first example accelerometer may be implemented in combination with the first, second, third, fourth, fifth, and/or sixth aspect of the first example accelerometer, though the example embodiments are not limited in this respect.

In an eighth aspect of the first example accelerometer, the ASIC further comprises a digital filter configured to filter the digital signals to provide filtered digital signals. In accordance with the eighth aspect, the RMS firmware is configured to perform the RMS calculation on the filtered digital signals to provide the RMS value that represents the amount of the acceleration of the object. In further accordance with the eighth aspect, the digital filter is configured to sample the representation of the digital signals at a sampling frequency that is greater than or equal to four times an output data rate of the RMS firmware. The eighth aspect of the first example accelerometer may be implemented in combination with the first, second, third, fourth, fifth, sixth, and/or seventh aspect of the first example accelerometer, though the example embodiments are not limited in this respect.

In a ninth aspect of the first example accelerometer, the ASIC further comprises a digital filter configured to down-sample a rolling average of the digital signals to provide a down-sampled rolling average signal. In accordance with the ninth aspect, the RMS firmware is configured to perform the RMS calculation on the down-sampled rolling average signal to provide the RMS value that represents the amount of the acceleration of the object. The ninth aspect of the first example accelerometer may be implemented in combination with the first, second, third, fourth, fifth, sixth, seventh, and/or eighth aspect of the first example accelerometer, though the example embodiments are not limited in this respect.

In a tenth aspect of the first example accelerometer, the RMS firmware is configured to perform a plurality of RMS calculations on the representation of the digital signals to provide a plurality of respective RMS values that represent respective amounts of the acceleration of the object with respect to respective frequencies. The tenth aspect of the first example accelerometer may be implemented in combination with the first, second, third, fourth, fifth, sixth, seventh, eighth, and/or ninth aspect of the first example accelerometer, though the example embodiments are not limited in this respect.

In an eleventh aspect of the first example accelerometer, the RMS firmware is configured to generate an interrupt signal based at least in part on the RMS value reaching a threshold. The eleventh aspect of the first example accelerometer may be implemented in combination with the first, second, third, fourth, fifth, sixth, seventh, eighth, ninth, and/or tenth aspect of the first example accelerometer, though the example embodiments are not limited in this respect.

In a first example method of making an accelerometer, a semiconductor package is fabricated to include a microelectromechanical systems (MEMS) device and an application-specific integrated circuit (ASIC). The fabricating comprises providing the MEMS device including a capacitive structure having a capacitance that is configured to change in response to acceleration of an object. The fabricating further comprises configuring the ASIC to determine acceleration of the object based at least in part on changes in the capacitance of the capacitive structure. The configuring comprises incorporating analog circuitry into the ASIC. The analog circuitry is configured to measure the changes in the capacitance of the capacitive structure and is further configured to generate analog signals that represent the changes in the capacitance. The configuring further comprises incorporating an analog-to-digital converter (ADC) into the ASIC. The ADC is configured to convert the analog signals to digital signals. The configuring further comprises incorporating RMS firmware into the ASIC. The RMS firmware is configured to perform a root-mean-square (RMS) calculation on a representation of the digital signals to provide an RMS value that represents an amount of the acceleration of the object.

In a first aspect of the first example method, providing the MEMS device comprises fabricating the MEMS device to include the capacitive structure. In accordance with the first aspect, configuring the ASIC comprises fabricating the ASIC.

In a first example of the first aspect, fabricating the ASIC comprises fabricating the analog circuitry, the ADC, and the RMS firmware on a common substrate.

In an implementation of the first example of the first aspect, fabricating the MEMS device comprises fabricating the MEMS device on the common substrate.

In a second example of the first aspect, fabricating the ASIC comprises fabricating a digital filter that includes a bandpass filter configured to block frequencies that are not included in a designated frequency band such that the digital filter is coupled between the ADC and the RMS firmware.

In a second aspect of the first example method, configuring the ASIC comprises configuring a digital filter to down-sample a rolling average of the digital signals to provide a down-sampled rolling average signal. In accordance with the second aspect, incorporating the RMS firmware into the ASIC comprises configuring the RMS firmware to perform the RMS calculation on the down-sampled rolling average signal to provide the RMS value that represents the amount of the acceleration of the object. The second aspect of the first example method may be implemented in combination with the first aspect of the first example method, though the example embodiments are not limited in this respect.

In a third aspect of the first example method, incorporating the RMS firmware into the ASIC comprises configuring the RMS firmware to perform a plurality of RMS calculations on the representation of the digital signals to provide a plurality of respective RMS values that represent respective amounts of the acceleration of the object with respect to respective frequencies. The third aspect of the first example method may be implemented in combination with the first and/or second aspect of the first example method, though the example embodiments are not limited in this respect.

In a fourth aspect of the first example method, incorporating the RMS firmware into the ASIC comprises configuring the RMS firmware to be capable of generating an interrupt signal based at least in part on the RMS value reaching a threshold. The fourth aspect of the first example method may be implemented in combination with the first, second, and/or third aspect of the first example method, though the example embodiments are not limited in this respect.

In a second example method of making an accelerometer, a semiconductor substrate is provided. A microelectromechanical systems (MEMS) device, which includes a capacitive structure having a capacitance that is configured to change in response to acceleration of an object, is formed on the semiconductor substrate. An application-specific integrated circuit (ASIC), which includes analog circuitry, an analog-to-digital converter (ADC), and RMS firmware, is formed on the semiconductor substrate to determine acceleration of the object based at least in part on changes in the capacitance of the capacitive structure. Forming the ASIC on the semiconductor substrate comprises configuring the analog circuitry to measure the changes in the capacitance of the capacitive structure and to generate analog signals that represent the changes in the capacitance. Forming the ASIC on the semiconductor substrate further comprises configuring the ADC to convert the analog signals to digital signals. Forming the ASIC on the semiconductor substrate further comprises configuring the RMS firmware to perform a root-mean-square (RMS) calculation on a representation of the digital signals to provide an RMS value that represents an amount of the acceleration of the object.

A second example accelerometer comprises a microelectromechanical systems (MEMS) device and an application-specific integrated circuit (ASIC). The MEMS device includes a capacitive structure having a capacitance that is configured to change in response to acceleration of an object. The application-specific integrated circuit (ASIC) is configured to determine acceleration of the object based at least in part on changes in the capacitance of the capacitive structure. The ASIC is configured to calculate a representative value that represents the changes in the capacitance in a designated frequency range, and provide an interrupt signal when the representative value is greater than or equal to a threshold value for at least a specified period of time. The representative value is a root-mean-square (RMS) of an input value.

In a first aspect of the second example accelerometer, the ASIC comprises driver circuitry, input circuitry, capacitors, and switches. The drive circuitry is configured to provide a drive signal to the MEMS device. The input circuitry is configured to receive an input signal that represents the changes in the capacitance of the capacitive structure from the MEMS device. The input signal is based at least in part on the drive signal. The capacitors are coupled between first nodes of the drive circuitry and second nodes of the input circuitry. The switches are coupled in series with the capacitors between the first nodes and the second nodes, and the switches are controllable to selectively couple the drive circuitry to the input circuitry via the capacitors. The ASIC is configured to calculate a differential signal that represents a difference between the input signal at the second nodes and the drive signal at the first nodes.

In a second aspect of the second example accelerometer, the MEMS device and the ASIC are included in a single package. The MEMS device has input terminals to receive the drive signal from the drive circuitry of the ASIC, and an output terminal to provide the input signal to the ASIC. The input terminals of the MEMS device and the drive circuitry of the ASIC are coupled by wire in the single package, and the output terminal of the MEMS device and the input circuitry of the ASIC are coupled by wire in the single package. The second aspect of the second example accelerometer may be implemented in combination with the first aspect of the second example accelerometer, though the example embodiments are not limited in this respect.

IV. Example Computing System Implementation

Figure 23:
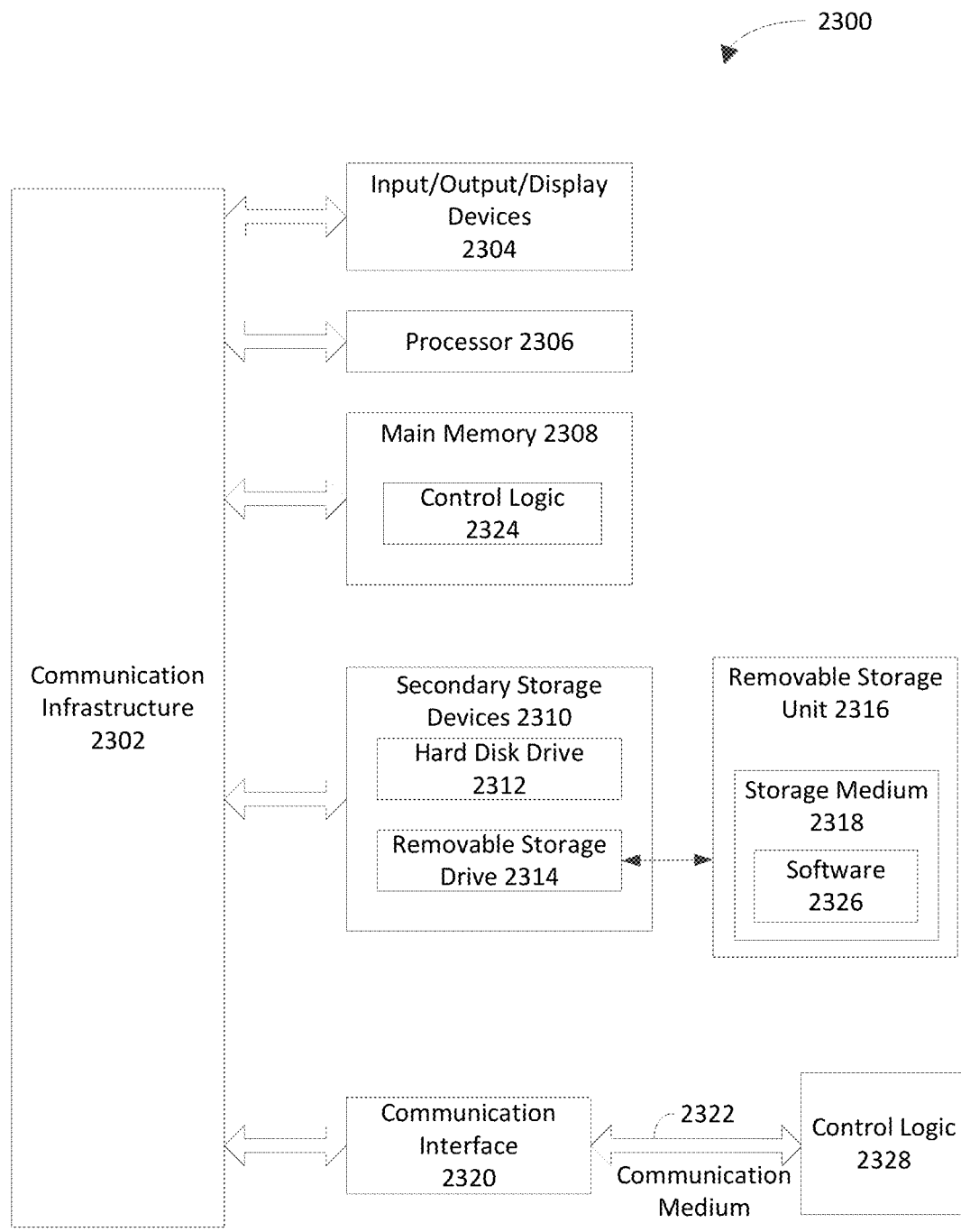
FIG. 23 is a block diagram of a computing system that may be used to implement various embodiments.

Example embodiments, systems, components, subcomponents, devices, methods, flowcharts, steps, and/or the like described herein, including but not limited to fabrication system 2200 and flowcharts 2000 and 2100 may be implemented in hardware (e.g., hardware logic/electrical circuitry), or any combination of hardware with software (computer program code configured to be executed in one or more processors or processing devices) and/or firmware. The embodiments described herein, including systems, methods/processes, and/or apparatuses, may be implemented using well known computing devices, such as computer 2300 shown in FIG. 23. For example, fabrication system 2200, each of the steps of flowchart 2000, and each of the steps of flowchart 2100 may be implemented using one or more computers 2300.

Computer 2300 can be any commercially available and well known communication device, processing device, and/or computer capable of performing the functions described herein, such as devices/computers available from International Business Machines®, Apple®, HP®, Dell®, Cray®, Samsung®, Nokia®, etc. Computer 2300 may be any type of computer, including a server, a desktop computer, a laptop computer, a tablet computer, a wearable computer such as a smart watch or a head-mounted computer, a personal digital assistant, a cellular telephone, etc.

Computer 2300 includes one or more processors (also called central processing units, or CPUs), such as a processor 2306. Processor 2306 is connected to a communication infrastructure 2302, such as a communication bus. In some embodiments, processor 2306 can simultaneously operate multiple computing threads. Computer 2300 also includes a primary or main memory 2308, such as random access memory (RAM). Main memory 2308 has stored therein control logic 2324 (computer software), and data.

Computer 2300 also includes one or more secondary storage devices 2310. Secondary storage devices 2310 include, for example, a hard disk drive 2312 and/or a removable storage device or drive 2314, as well as other types of storage devices, such as memory cards and memory sticks. For instance, computer 2300 may include an industry standard interface, such a universal serial bus (USB) interface for interfacing with devices such as a memory stick. Removable storage drive 2314 represents a floppy disk drive, a magnetic tape drive, a compact disk drive, an optical storage device, tape backup, etc.

Removable storage drive 2314 interacts with a removable storage unit 2316. Removable storage unit 2316 includes a computer useable or readable storage medium 2318 having stored therein computer software 2326 (control logic) and/or data. Removable storage unit 2316 represents a floppy disk, magnetic tape, compact disk (CD), digital versatile disc (DVD), Blu-ray disc, optical storage disk, memory stick, memory card, or any other computer data storage device. Removable storage drive 2314 reads from and/or writes to removable storage unit 2316 in a well-known manner.

Computer 2300 also includes input/output/display devices 2304, such as touchscreens, LED and LCD displays, keyboards, pointing devices, etc.

Computer 2300 further includes a communication or network interface 2320. Communication interface 2320 enables computer 2300 to communicate with remote devices. For example, communication interface 2320 allows computer 2300 to communicate over communication networks or mediums 2322 (representing a form of a computer useable or readable medium), such as local area networks (LANs), wide area networks (WANs), the Internet, etc. Network interface 2320 may interface with remote sites or networks via wired or wireless connections. Examples of communication interface 2320 include but are not limited to a modem (e.g., for 4G and/or 5G communication(s)), a network interface card (e.g., an Ethernet card for Wi-Fi and/or other protocols), a communication port, a Personal Computer Memory Card International Association (PCMCIA) card, a wired or wireless USB port, etc. Control logic 2328 may be transmitted to and from computer 2300 via the communication medium 2322.

Any apparatus or manufacture comprising a computer useable or readable medium having control logic (software) stored therein is referred to herein as a computer program product or program storage device. Examples of a computer program product include but are not limited to main memory 2308, secondary storage devices 2310 (e.g., hard disk drive 2312), and removable storage unit 2316. Such computer program products, having control logic stored therein that, when executed by one or more data processing devices, cause such data processing devices to operate as described herein, represent embodiments. For example, such computer program products, when executed by processor 2306, may cause processor 2306 to perform any of the steps of flowchart 1300 of FIG. 13 and/or flowchart 1500 of FIG. 15.

Devices in which embodiments may be implemented may include storage, such as storage drives, memory devices, and further types of computer-readable media. Examples of such computer-readable storage media (e.g., non-transitory media) include a hard disk, a removable magnetic disk, a removable optical disk, flash memory cards, digital video disks, random access memories (RAMs), read only memories (ROM), and the like. As used herein, the terms "computer program medium" and "computer-readable medium" are used to generally refer to the hard disk associated with a hard disk drive, a removable magnetic disk, a removable optical disk (e.g., CD ROMs, DVD ROMs, etc.), zip disks, tapes, magnetic storage devices, optical storage devices, MEMS-based storage devices, nanotechnology-based storage devices, as well as other media such as flash memory cards, digital video discs, RAM devices, ROM devices, and the like. Such computer-readable storage media may store program modules that include computer program logic to implement, for example, embodiments, systems, components, subcomponents, devices, methods, flowcharts, steps, and/or the like described herein (as noted above), and/or further embodiments described herein. Embodiments are directed to computer program products comprising such logic (e.g., in the form of program code, instructions, or software) stored on any computer useable medium. Such program code, when executed in one or more processors, causes a device to operate as described herein.

Note that such computer-readable storage media are distinguished from and non-overlapping with communication media (do not include communication media). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media. Embodiments are also directed to such communication media.

The disclosed technologies can be put into practice using software, firmware, and/or hardware implementations other than those described herein. Any software, firmware, and hardware implementations suitable for performing the functions described herein can be used.

V. Conclusion

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:
1. An accelerometer comprising:
  a microelectromechanical systems (MEMS) device that includes a capacitive structure having a capacitance that is configured to change in response to acceleration of an object; and an application-specific integrated circuit (ASIC) configured to determine acceleration of the object based at least in part on changes in the capacitance of the capacitive structure, the ASIC comprising:
  analog circuitry configured to measure the changes in the capacitance of the capacitive structure, the analog circuitry further configured to generate analog signals that represent the changes in the capacitance;
  an analog-to-digital converter (ADC) configured to convert the analog signals to digital signals;
  RMS firmware configured to perform a root-mean-square (RMS) calculation on a representation that is based on the digital signals to provide an RMS value that represents an amount of the acceleration of the object; and
  an interrupt controller configured to provide an interrupt signal, based at least in part on the RMS value being greater than or equal to a threshold value for at least a specified period of time.

2. The accelerometer of claim 1, wherein the MEMS device and the ASIC are implemented on a common semiconductor chip.

3. The accelerometer of claim 1, wherein the ASIC further comprises:
  a digital filter configured to filter the digital signals to provide filtered digital signals;
  wherein the RMS firmware is configured to perform the RMS calculation on the filtered digital signals to provide the RMS value that represents the amount of the acceleration of the object; and
  wherein the digital filter includes at least one Butterworth filter.

4. The accelerometer of claim 1, wherein the ASIC further comprises:
  a digital filter configured to filter the digital signals to provide filtered digital signals;
  wherein the RMS firmware is configured to perform the RMS calculation on the filtered digital signals to provide the RMS value that represents the amount of the acceleration of the object; and
  wherein the digital filter includes at least one Bessel filter.

5. The accelerometer of claim 1, wherein the ASIC further comprises:
  a digital filter configured to filter the digital signals to provide filtered digital signals;
  wherein the RMS firmware is configured to perform the RMS calculation on the filtered digital signals to provide the RMS value that represents the amount of the acceleration of the object; and
  wherein the digital filter includes at least one Chebyshev filter.

6. The accelerometer of claim 1, wherein the ASIC further comprises:
  a digital filter configured to filter the digital signals to provide filtered digital signals;
  wherein the RMS firmware is configured to perform the RMS calculation on the filtered digital signals to provide the RMS value that represents the amount of the acceleration of the object; and
  wherein the digital filter includes a bandpass filter configured to block frequencies that are not included in a designated frequency band.

7. The accelerometer of claim 1, wherein the ASIC further comprises:
  a digital filter configured to filter the digital signals to provide filtered digital signals;
  wherein the RMS firmware is configured to perform the RMS calculation on the filtered digital signals to provide the RMS value that represents the amount of the acceleration of the object;
  wherein the digital filter includes a plurality of signal processing filters; and
  wherein each of the plurality of signal processing filters has a set of user-programmable coefficients that are capable of having a plurality of sets of values, at least a first set of values causing the respective signal processing filter to be configured as a Butterworth filter, at least a second set of values causing the respective signal processing filter to be configured as a Bessel filter.

8. The accelerometer of claim 1, wherein the ASIC further comprises:
  a digital filter configured to filter the digital signals to provide filtered digital signals;
  wherein the RMS firmware is configured to perform the RMS calculation on the filtered digital signals to provide the RMS value that represents the amount of the acceleration of the object; and
  wherein the digital filter is configured to sample the representation of the digital signals at a sampling frequency that is greater than or equal to an output data rate of the RMS firmware.

9. The accelerometer of claim 1, wherein the ASIC further comprises:
  a digital filter configured to filter the digital signals to provide filtered digital signals;
  wherein the RMS firmware is configured to perform the RMS calculation on the filtered digital signals to provide the RMS value that represents the amount of the acceleration of the object; and
  wherein the digital filter is configured to sample the representation of the digital signals at a sampling frequency that is greater than or equal to four times an output data rate of the RMS firmware.

10. The accelerometer of claim 1, wherein the ASIC further comprises:
  a digital filter configured to down-sample a rolling average of the digital signals to provide a down-sampled rolling average signal; and
  wherein the RMS firmware is configured to perform the RMS calculation on the down-sampled rolling average signal to provide the RMS value that represents the amount of the acceleration of the object.

11. The accelerometer of claim 1, wherein the RMS firmware is configured to perform a plurality of RMS calculations on the representation of the digital signals to provide a plurality of respective RMS values that represent respective amounts of the acceleration of the object with respect to respective frequencies.

12. The accelerometer of claim 1, wherein the interrupt controller is further configured to provide the interrupt signal, based at least in part on the RMS value being less than or equal to a second threshold value; and
  wherein the threshold value is greater than the second threshold value.

13. A method of making an accelerometer, the method comprising:
  fabricating a semiconductor package to include a micro-electromechanical systems (MEMS) device and an application-specific integrated circuit (ASIC), the fabricating comprising:

providing the MEMS device including a capacitive structure having a capacitance that is configured to change in response to acceleration of an object; and
configuring the ASIC to determine acceleration of the object based at least in part on changes in the capacitance of the capacitive structure, the configuring comprising:
incorporating analog circuitry into the ASIC, the analog circuitry configured to measure the changes in the capacitance of the capacitive structure and further configured to generate analog signals that represent the changes in the capacitance;
incorporating an analog-to-digital converter (ADC) into the ASIC, the ADC configured to convert the analog signals to digital signals;
incorporating RMS firmware into the ASIC, the RMS firmware configured to perform a root-mean-square (RMS) calculation on a representation that is based on the digital signals to provide an RMS value that represents an amount of the acceleration of the object; and
incorporating an interrupt controller into the ASIC, the interrupt controller configured to provide an interrupt signal, based at least in part on the RMS value being greater than or equal to a threshold value for at least a specified period of time.

14. The method of claim 13, wherein providing the MEMS device comprises:
fabricating the MEMS device to include the capacitive structure; and
wherein configuring the ASIC comprises:
fabricating the ASIC.

15. The method of claim 14, wherein fabricating the ASIC comprises:
fabricating the analog circuitry, the ADC, and the RMS firmware on a common substrate.

16. The method of claim 15, wherein fabricating the MEMS device comprises:
fabricating the MEMS device on the common substrate.

17. The method of claim 14, wherein fabricating the ASIC comprises:
fabricating a digital filter that includes a bandpass filter configured to block frequencies that are not included in a designated frequency band such that the digital filter is coupled between the ADC and the RMS firmware.

18. The method of claim 13, wherein configuring the ASIC comprises:
configuring a digital filter to down-sample a rolling average of the digital signals to provide a down-sampled rolling average signal; and
wherein incorporating the RMS firmware into the ASIC comprises:
configuring the RMS firmware to perform the RMS calculation on the down-sampled rolling average signal to provide the RMS value that represents the amount of the acceleration of the object.

19. The method of claim 13, wherein incorporating the RMS firmware into the ASIC comprises:
configuring the RMS firmware to perform a plurality of RMS calculations on the representation of the digital signals to provide a plurality of respective RMS values that represent respective amounts of the acceleration of the object with respect to respective frequencies.

20. A method of making an accelerometer, the method comprising:
providing a semiconductor substrate;
forming a microelectromechanical systems (MEMS) device, which includes a capacitive structure having a capacitance that is configured to change in response to acceleration of an object, on the semiconductor substrate; and
forming an application-specific integrated circuit (ASIC), which includes analog circuitry, an analog-to-digital converter (ADC), RMS firmware, and an interrupt controller, on the semiconductor substrate to determine acceleration of the object based at least in part on changes in the capacitance of the capacitive structure, wherein forming the ASIC on the semiconductor substrate comprises:
configuring the analog circuitry to measure the changes in the capacitance of the capacitive structure and to generate analog signals that represent the changes in the capacitance;
configuring the ADC to convert the analog signals to digital signals;
configuring the RMS firmware to perform a root-mean-square (RMS) calculation on a representation that is based on the digital signals to provide an RMS value that represents an amount of the acceleration of the object; and
configuring the interrupt controller to provide an interrupt signal, based at least in part on the RMS value being greater than or equal to a threshold value for at least a specified period of time.

21. An accelerometer comprising:
a microelectromechanical systems (MEMS) device that includes a capacitive structure having a capacitance that is configured to change in response to acceleration of an object; and
an application-specific integrated circuit (ASIC) configured to determine acceleration of the object based at least in part on changes in the capacitance of the capacitive structure, the ASIC configured to:
calculate a representative value that represents the changes in the capacitance in a designated frequency range, wherein the representative value is a root-mean-square (RMS) of an input value; and
based at least in part on the representative value being greater than or equal to a threshold value for at least a specified period of time, provide an interrupt signal.

22. The accelerometer according to claim 21, wherein the ASIC comprises:
drive circuitry configured to provide a drive signal to the MEMS device;
input circuitry configured to receive an input signal that represents the changes in the capacitance of the capacitive structure from the MEMS device, wherein the input signal is based at least in part on the drive signal;
capacitors coupled between first nodes of the drive circuitry and second nodes of the input circuitry; and
switches coupled in series with the capacitors between the first nodes and the second nodes, wherein the switches are controllable to selectively couple the drive circuitry to the input circuitry via the capacitors;
wherein the ASIC is configured to calculate a differential signal that represents a difference between the input signal at the second nodes and the drive signal at the first nodes.

23. The accelerometer according to claim 22, wherein the MEMS device and the ASIC are included in a single package;

wherein the MEMS device has input terminals to receive the drive signal from the drive circuitry of the ASIC;

wherein the MEMS device has an output terminal to provide the input signal to the ASIC;

wherein the input terminals of the MEMS device and the drive circuitry of the ASIC are coupled by wire in the single package; and wherein the output terminal of the MEMS device and the input circuitry of the ASIC are coupled by wire in the single package.

24. The accelerometer of claim 21, wherein the ASIC is further configured to provide the interrupt signal, based at least in part on the representative value being less than or equal to a second threshold value, which is less than the threshold value.

* * * * *